US007960866B2

(12) United States Patent
Ikeda

(10) Patent No.: US 7,960,866 B2
(45) Date of Patent: Jun. 14, 2011

(54) PULSE GENERATION CIRCUIT AND UWB COMMUNICATION DEVICE

(75) Inventor: Masayuki Ikeda, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 104 days.

(21) Appl. No.: 12/250,824

(22) Filed: Oct. 14, 2008

(65) Prior Publication Data

US 2009/0096292 A1 Apr. 16, 2009

(30) Foreign Application Priority Data

Oct. 15, 2007 (JP) ................................ 2007-267492

(51) Int. Cl.
*H02J 1/00* (2006.01)
*H02H 3/00* (2006.01)

(52) U.S. Cl. ........... 307/85; 375/130; 375/237; 375/238

(58) Field of Classification Search ........................ None
See application file for complete search history.

(56) References Cited

U.S. PATENT DOCUMENTS 6,421,389 B1 7/2002 Jett et al.
7,102,405 B2 * 9/2006 Hisamoto et al. ............. 327/172
7,715,502 B2 * 5/2010 Kim et al. ..................... 375/340
2001/0033576 A1 10/2001 Richards
2003/0108133 A1 6/2003 Richards
2004/0165661 A1 * 8/2004 Braun ........................... 375/238
2007/0058769 A1 * 3/2007 Ikeda ............................ 375/376
2007/0083119 A1 * 4/2007 Adachi et al. ................. 600/437

OTHER PUBLICATIONS

Barajas, E. et al.; "A Low-Power Template Generator for Coherent Impulse-Radio Ultra Wide-Band Receivers" (Abstract only); *The 2006 IEEE 2006 International Conference on Ultra-Wideband*; Sep. 2006; pp. 97-102; Waltham, Mass. Available Web Site: ieeexplore.ieee.org Accessed on: May 26, 2008.

Terada, T. et al.; "A CMOS Impulse Radio Ultra-Wideband transceiver for 1Mb/s data communications and ±2.5cm range findings"; *2005 Symposium on VLSI Circuits Digest of Technical Papers*; 2005; pp. 30-33; Kyoto, Japan.

* cited by examiner

*Primary Examiner* — Jared J Fureman
*Assistant Examiner* — Justen Fauth
(74) *Attorney, Agent, or Firm* — Kilpatrick Townsend & Stockton LLP

(57) ABSTRACT

A pulse generation circuit for outputting a pulse with a predetermined waveform to an output terminal in response to a start signal includes a circuit adapted to generate a plurality of signals {Di|i denotes an integer in a predetermined range}, which has predetermined amounts of time differences from the start signal, based on the start signal, a plurality of power supplies {Ej|j denotes an integer} adopted to supply electric energy of a predetermined electric quantity, and a switching circuit adapted to sequentially switch the power supplies {Ej} in a predetermined order in accordance with logical function values of at least a part of the signals {Di} to connect the power supplies {Ej} to the output terminal.

3 Claims, 18 Drawing Sheets

PULSE GENERATION CIRCUIT AND UWB COMMUNICATION DEVICE

BACKGROUND

1. Technical Field

The present invention relates to a pulse generation circuit for generating pulses suitable for Ultra Wide Band (UWB) communication, and a UWB communication device.

2. Related Art

The UWB communication is a communication method for performing high speed large capacity data communication using a very wide frequency band. As the communication method using wide-band signals, there are cited a spread spectrum system and orthogonal frequency division multiplexing (OFDM) in the related art. However, UWB is a further wide-band communication method using pulses with very short period of time, and is also called impulse radio (IR) communication. In the IR systems, modulation and demodulation can be performed only by time-base operations in contrast to the modulation in the related art, and simplification of the circuit and reduction of power consumption are considered to be expected (see the specifications of U.S. Pat. No. 6,421,389, US-2003/0108133-A1, and US-2001/0033576).

Hereinafter, pulse waveforms used for the IR systems will briefly be explained with reference to the drawings.

The pulse train with a pulse width $P_D$ and a period $T_P$ shown in FIG. 17A, as well known, has a frequency spectrum, which is a sinc function with an envelope having the first zero point at the frequency of $BW=1/P_D$ as shown in FIG. 17B.

The pulse as shown in FIG. 17B is hard to use because the pulse has the spectrum extending from direct-current to BW, and the pulse having the center frequency $f_0$ of the spectrum in a high frequency band as shown in FIG. 17D has the preference. This pulse waveform is obtained by cutting rectangular waves with the frequency $f_0=1/(2P_W)$ from the pulse shown in FIG. 17A to shift the frequency spectrum towards a higher frequency. It should be noted that this waveform includes the direct-current (DC) component as illustrated with the dashed line 1301 in FIG. 17C, and therefore, does not have the ideal spectrum as shown in FIG. 17D, to be exact.

The waveform having such an ideal spectrum is shown in FIG. 17E. This waveform is obtained by multiplying the pulses shown in FIG. 17A by the sinusoidal wave with the carrier frequency $f_0$. Further, FIG. 17F shows a waveform obtained by multiplying the pulses shown in FIG. 17A by a rectangular wave with the carrier frequency $f_0$, which can easily be generated by a digital circuit. Since the pulse width is so narrow that such a square waveform is not formed even by the digital circuit, the waveform shown in FIG. 17E can be obtained. Although there are designed various other pulse waveforms ideal for the UWB communication different from the waveform shown here, since the generation method is simple, it is used frequently.

Related-Art Example 1

FIG. 12 shows a circuit example of the related art for generating the pulses shown in FIG. 17C (see A CMOS IMPULSE RADIO ULTRA-WIDEBAND TRANSCEIVER FOR 1 Mb/s DATA COMMUNICATION AND ±2.5 cm RANGE FINDINGS (T. Terada et al., 2005 Symposium on VLSI Circuits Digest of Technical Papers, pp. 30-33)). Two inverters 1001, 1002 and a negative OR circuit (NOR) 1003 form a three-stage ring oscillator circuit when the other input Ci of the NOR circuit 1003 becomes false (L: a low level). In other words, as shown in the time chart of FIG. 13, the oscillation is caused only while the input Ci is in L, the transitions in the output NR of the NOR circuit 1003 and the outputs N1, N2 of the inverters 1001, 1002 are propagated sequentially with delay time $t_d$.

Here, it is assumed that the rising time and the falling time are the same in the NOR circuit and the inverters 1001, 1002 for the sake of simplicity. Therefore, the width ($P_W$ in FIG. 17C) of the pulse generated by this circuit becomes $3t_d$. In other words, the pulse width three times as long as the delay time of the element forming the circuit is the smallest possible width of the pulse generated, which forms the upper limit of the thinnest possible pulse generated by the circuit.

Related-Art Example 2

As a circuit for generating thinner pulses than those generated by the circuit described above, the following circuit has been designed. Further, the pulses the circuit described above can generate include a DC component. As the circuit for generating such pulses without a DC component as shown in FIGS. 17E and 17F, there is cited a circuit shown in FIG. 14. The time chart of FIG. 15 is provided for explaining the operation of the circuit.

In FIG. 14, delay circuits (inverters) 1100 through 1109 are composed of ten stages of inverters connected in series. The internal configuration of each stage of the inverters will be described later with reference to FIG. 16.

A pulse D0 input to a terminal 1133 is propagated in the delay circuits while being the delay time $t_d$ delayed and inverted in logic in every stage, and output from each of the stages as shown in the parts B through L of FIG. 15. Specifically, assuming that the signal applied to the input terminal 1133 is positive logic, XDi is output from the ith stage if i is an odd number, or Di is output therefrom if i is an even number. It should be noted that X is a symbol attached to the front of a name of a signal for representing the inverted logic of the signal.

N-channel MOS transistors 1113 and 1112 each become a conducting state to connect a pulse output terminal 1130 (described as PulseOut in the drawing) to a first voltage level 1129 (V1) when the output XD1 of the first stage and the output D2 of the second stage of the delay circuits are in the high level. Then, P-channel MOS transistors 1111 and 1110 each become a conducting state to connect the pulse output terminal 1130 to a second voltage level 1126 (V2) when the output D2 of the second stage and the output XD3 of the third stage of the delay circuits are in the low level (i.e., both of the inverted logic of D2 and D3 are in the high level (the logical multiplication thereof is true)).

Similarly, N-channel MOS transistors 1116, 1117, 1120, 1121, 1124, and 1125 each become a conducting state to connect the pulse output terminal 1130 to the first voltage level V1 when the output XDi−1 of the i−1th stage and the output Di of the ith stage of the delay circuits are in the high level, namely, when the logical multiplication of XDi−1 and Di is true. Here, i is an even number. Then, P-channel MOS transistors 1114, 1115, 1118, 1119, 1122, and 1123 each become a conducting state to connect the pulse output terminal 1130 to the second voltage level V2 when the output Di of the ith stage and the output XDi+1 of the i+1th stage of the delay circuits are in the low level, namely, when the logical multiplication of the inverted output XDi of the output Di and the inverted-logic output Di+1 of the output XDi+1 is true.

The pulse waveform shown in the part M of FIG. 15 can be obtained by the operation described above, thus the pulse waveforms as shown in FIGS. 17E and 17F can be generated.

Here, although it is possible to use the negative and positive power supply voltages VSS, VDD of the integrated circuits forming the circuit as the first and second voltage levels, it is also possible to set other arbitrary voltages as the first and second voltages.

A P-channel MOS transistor 1127 and an N-channel MOS transistor 1128 are MOS resistors, which divide the first and second voltages V1, V2 to set the voltage (V0) of the output terminal 1130 when the switching circuits of the MOS transistors 1110 through 1125 connect the output terminal 1130 to neither the first voltage V1 nor the second voltage V2. Typically, the voltage is designed to have an intermediate value between the first and second voltages V1, V2 so as to keep the symmetric property of the constant of the N- and P-channel transistors. Further, transistors 1131, 1132 have a function for pulling back the potential to V0 in a time period t shown in FIG. 15, namely the trailing edge of the pulse thus generated. Although the transistors 1127 and 1128 also pull back the potential to V0, since these transistors have high on-resistances, it takes long time before the potential reaches V0, which makes it difficult to generate a correct pulse. The transistors 1131 and 1132 discharge the charge stored in the load capacitance of the output terminal 1130 to try to make the potential of the pulse output terminal 1130 become the first voltage V1. Therefore, it is designed that the potential becomes V0 just in the time period $t_9$ by adjusting the on-resistances of the transistors 1131 and 1132, or by reducing the amount of delay of the delay circuit 1109.

FIG. 16 is a diagram showing the internal configuration of the each of the inverters 1100 through 1109 forming the delay circuits. A P-channel MOS transistor 1202 and an N-channel MOS transistor 1203 form the inverter circuit, and the signal input to a terminal 1208 is output from a terminal 1210 together with the delay time $t_d$ and inverted, thus forming a delay circuit input 1210 of the following stage. At the same time, the signal is taken out through a small buffer circuit 1205 so as not to increase the amount of delay of the delay circuit formed of the transistors 1202, 1203, and further, taken out by the buffer circuit 1206 as an output 1211 for driving the switching transistors 1110 through 1125, 1131, and 1132 shown in FIG. 14. It should be noted that the buffers 1205, 1206 are omitted in FIG. 14.

An N-channel MOS transistor 1204 is inserted in series to the source of transistor 1203 forming the inverter described above and is connected to the negative power supply while a P-channel transistor 1201 inserted in series to the source of transistor 1202 forming the inverter and is connected to the positive power supply VDD 1217.

By controlling the gate-source voltages Vbp, Vbn of these transistors 1201, 1204, it is possible to control the power supply current flowing into the inverter. Typically, the voltages Vbp and Vbn are controlled to have the absolute values equal to each other for keeping the symmetrical property of the leading edge and trailing edge of the delay circuit output. This control makes it possible to control the operation speed of the inverter, thus controlling the delay time $t_d$. In order for generating the pulse having the target frequency spectrum, it is enough only to control voltages of terminals 1207 and 1209 so as to achieve $P_W = t_d$.

Related-Art Example 3

In the UWB communication, the pulses thus generated are not only used in transmitters but also used in receivers as the template pulse for calculating correlation with received signals. In the receivers, differential signal processing is often executed, and in many cases, a pair of signals having phases reversed to each other as shown in FIG. 17G are required. The differential pulse signals are effective to the case in which the transmitter drives a balanced antenna. In receiving circuits, there is often the case in which a so-called IQ signal including an in-phase signal and a quadrature signal having phases 90 degrees different from each other is required.

A Low-Power Template Generator for Coherent Impulse-Radio Ultra Wide-Band Receivers (Jose Luis et al., Proceedings IEEE ICUWB, 2006 pp. 97-102) presents a circuit for generating balanced pulses. This circuit has some stages of differential delay circuits cascaded to generate a pulse train with a pulse width corresponding to an amount of delay of each of the stages of delay circuits using a logic circuit. This document suggests a possibility of starting the pulse by both of a rising edge and a falling edge of a signal input to the delay circuit, thereby reducing power consumption, and a possibility of using the delay circuit every other stage, thereby generating the IQ signal.

The pulse generation circuit of the related art described above is capable of accurately generating ultra high-frequency and ultra wide-band pulses necessary for a UWB communication while having a simple circuit configuration. The thin pulses corresponding the performance limitation of the elements forming the circuit can be generated.

However, as is well known, and as shown in FIGS. 17A through 17G, the spectrum characteristics of the pulses generated by the circuit of the related art described above are the sinc function having a very broad side lobe, and therefore, some sort of band limitation is necessary to use the pulses generated by the circuit for communication. In the related art, the circuit is used with the band limitation performed by a filter.

However, as the filter, a bandpass filter with a preferable skirt characteristic in an ultra wide band and at an ultra high frequency close to the performance limit of the elements is required, which is hard to configure.

SUMMARY

In view of the problems of the circuit of the related art described above, the invention has an advantage of realizing a circuit for generating an accurate short pulses with a limited band, achieving low power consumption with a circuit as simple as the circuit of the related art, thereby obtaining target pulses without using a filter.

In order for solving the above problems, the technologies listed below will be proposed in the present application.

Application Example 1

A pulse generation circuit for outputting a pulse with a predetermined waveform to an output terminal in response to a start signal includes a circuit adapted to generate a plurality of signals {Di|i denotes an integer in a predetermined range}, which has predetermined amounts of time differences from the start signal, based on the start signal, a plurality of power supplies {Ej|j denotes an integer} adopted to supply electric energy of a predetermined electric quantity, and a switching circuit adapted to sequentially switch the power supplies {Ej} in a predetermined order in accordance with logical function values of at least a part of the signals {Di} to connect the power supplies {Ej} to the output terminal.

According to the pulse generation circuit of the application example 1, the pulse is generated by sequentially connecting the outputs of the plurality of power supplies while switching the plurality of power supplies by the switching circuit. It should be noted here that {Di|i denotes an integer in a predetermined range}, {Ej|j denotes an integer} are descriptions used in the set theory for representing a set. According to the description rule for {*|**}, the anterior part of "|" denotes elements of the set, and the posterior part of "|" denotes the explanation thereof. The posterior part can be omitted. The plurality of power supplies {Ej} is provided, and Ei connected to the output are switched in accordance with the logic of {Di}. Therefore, the frequency spectrum of the output pulse can be modified in accordance with setting of the output values of the plurality of power supplies {Ej}. It is possible to set the spectrum so as to have a small side lobe in accordance with the setting values of the power supplies {Ej}. Thus, it becomes possible to generate a pulse on which the band limitation is executed with a simple circuit configuration. According to the above configuration of the invention, since it is possible to execute the band limitation without requiring any special filters for limiting the band of the pulse, extremely high availability for configuring the UWB communication device is provided.

Application Example 2

In the pulse generation circuit according to the application example 1, the circuit adapted to generate a plurality of signals {Di} having predetermined amounts of time differences is formed of delay circuits each having a predetermined delay amount connected in series.

According to the pulse generation circuit of the application example 2, the circuit for generating the signals {Di} for controlling the switching circuit is formed of delay circuits connected in series. Thus, it becomes possible to provide a circuit which can easily be formed even on a semiconductor integrated circuit.

Application Example 3

In the pulse generation circuit according to one of the application examples 1 and 2, each of the plurality of power supplies {Ej} is a voltage source having a sampling value of an envelope of the pulse intended to be output as an output voltage.

According to the pulse generation circuit of the application example 3, the envelope of the output pulse can be determined by the power supplies {Ej}, and the envelope of the pulse has a close relation to the frequency spectrum thereof. It becomes possible to control the envelope of the output pulse by the setting values of the power supplies {Ej}, and the control of the spread of the frequency spectrum, namely the band limitation becomes possible. According to the above configuration of the invention, since it is possible to execute the band limitation without requiring any special filters for limiting the band of the pulse, extremely high availability for configuring the UWB communication device is provided.

Application Example 4

A pulse generation circuit for outputting a pulse with a predetermined waveform to an output terminal in response to a start signal includes a circuit adapted to generate a plurality of signals {Di|i denotes an integer in a predetermined range}, which has predetermined amounts of time differences from the start signal, based on the start signal, a pulse width signal generation circuit adapted to generate a signal having a pulse width corresponding to a duration of the pulse intended to be generated based on the start signal, a filter adapted to limit a band of the output signal of the pulse width signal generation circuit, and a switching circuit adapted to alternately switch an output of the filter and a predetermined power supply in accordance with logical function values of at least a part of the signals {Di} to alternately connect the output of the filter and the power supply to the output terminal.

According to the pulse generation circuit of the application example 4, the pulse generation circuit obtains the signal having a pulse width corresponding to the pulse duration to execute the band limitation on the signal, and performs switching between the signal and the predetermined power supply voltage in accordance with the logical function having {Di} as logic variables. In the case of such a configuration, a low-pass filter can be used as the filter for band limitation. Moreover, the frequency thereof is about a half of the reciprocal of the pulse duration, which is far lower than the center frequency of the output pulse. There is no need for using a band-pass filter with a high operating frequency range such as a frequency range centering on the center frequency of the output pulse used in the band limitation in the related art, which simplifies the configuration, and further, provides stable and accurate pulses.

Application Example 5

A pulse generation circuit for outputting a pulse with a predetermined waveform to an output terminal in response to a start signal includes a circuit adapted to generate a plurality of signals {Di|i denotes an integer in a predetermined range}, which has predetermined amounts of time differences from the start signal, based on the start signal, a pulse width signal generation circuit adapted to generate a pair of complementary signals each having a pulse width corresponding to a duration of the pulse intended to be generated based on the start signal, a pair of filters adapted to limit bands of the respective output signals of the pulse width signal generation circuit, and a switching circuit adapted to alternately switch outputs of the pair of filters in accordance with logical function values of at least a part of the signals {Di} to alternately connect the outputs of the pair of filters to the output terminal.

According to the pulse generation circuit of the application example 5, the pulse generation circuit obtains the pair of complementary signals each having a pulse width corresponding to the pulse duration to execute the band limitation on the signals, and performs switching between the pair of signals in accordance with the logical function having {Di} as logic variables. In the case of such a configuration, a low-pass filter can be used as the filter for band limitation. Moreover, the frequency thereof is about a half of the reciprocal of the pulse duration, which is far lower than the center frequency of the output pulse. There is no need for using a band-pass filter with a high operating frequency range such as a frequency range centering on the center frequency of the output pulse used in the band limitation in the related art, which simplifies the configuration, and further, provides stable and accurate pulses.

Application Example 6

In the pulse generation circuit according to one of the application examples 4 and 5, the circuit adapted to generate a plurality of signals {Di} having predetermined amounts of time differences is formed of delay circuits each having a predetermined delay amount connected in series.

According to the pulse generation circuit of the application example 6, {Di} can be generated by a delay circuit train which can easily be formed using an integrated circuit. Thus, the circuit can easily be formed as an integrated circuit, and therefore, downsizing, reliability enhancement, and price reduction of equipment become possible.

Application Example 7

In the pulse generation circuit according to one of the application examples 4 and 5, the circuit adapted to generate a plurality of signals {Di} having predetermined amounts of time differences is formed of a ring oscillation circuit including a delay circuit having a predetermined delay amount in at least a part of the ring oscillation circuit.

According to the pulse generation circuit of the application example 7, {Di} can be generated by a ring oscillation circuit which can easily be formed using an integrated circuit. Thus, the circuit can easily be formed as an integrated circuit, and therefore, downsizing, reliability enhancement, and price reduction of equipment become possible.

Application Example 8

A UWB communication device is configured including the pulse generation circuit according to any one of the application examples 1 through 7.

In the UWB communication device of the application example 8, since a very thin and accurate pulse specific to UWB can easily be generated by the pulse generation circuits according to the application examples 1 through 7, by using these circuits as the template pulse generation circuit of the modulation circuit or the demodulation circuit, it becomes possible to adopt such a stable circuit mode, thus it becomes possible to compose a stable, reliable, and sensitive device at a low price. In particular, the pulse generation circuit according to the application examples of the invention is capable of generating an accurate pulse with a frequency as high as the performance limit of the component, and has high availability.

The pulse generation circuit as the embodiment of the invention can be formed of a CMOS integrated circuit or the like, and is capable of generating a pulse having an accurate waveform with a simple circuit even in the case with the pulse as thin as the operational transition duration of the component. Further, since the circuit can be formed of a logic circuit using a CMOS integrated circuit, it is possible to form a configuration capable of easily operating at the maximum speed of the CMOS circuit without increasing the operating power, thus a high-frequency wide-band pulse, which can be used for the UWB communication, can easily be generated.

BRIEF DESCRIPTION OF THE DRAWINGS

The invention will now be described with reference to the accompanying drawings, wherein like numbers reference like elements.

DESCRIPTION OF EXEMPLARY EMBODIMENTS

A pulse generation circuit according to some embodiments of the invention will hereinafter be explained with reference to the accompanying drawings.

Figure 17A:
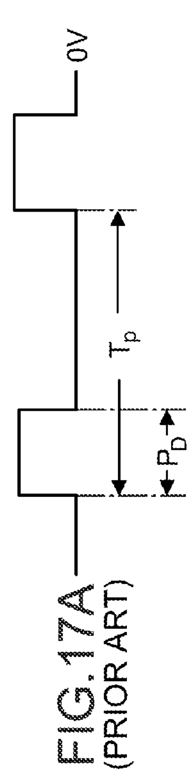
FIGS. 17A through 17G are diagrams for explaining a pulse (hereinafter referred to as a target pulse) the embodiments of the invention intend to generate.
Figure 17B:
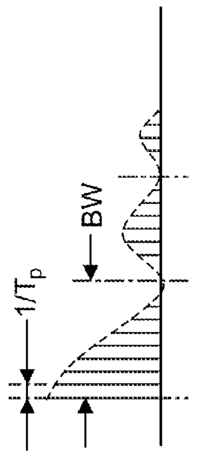
Figure 17C:
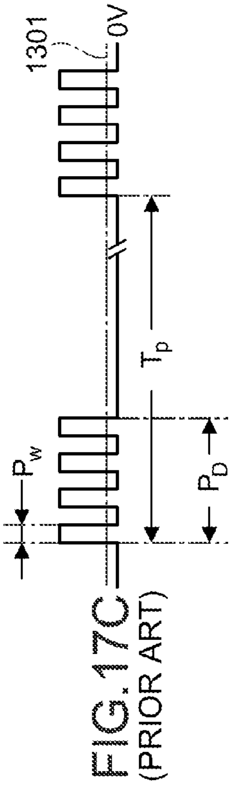
Figure 17D:
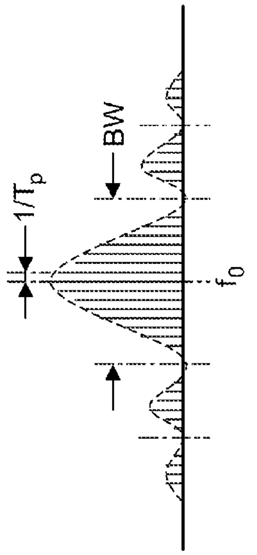
Figure 17E:
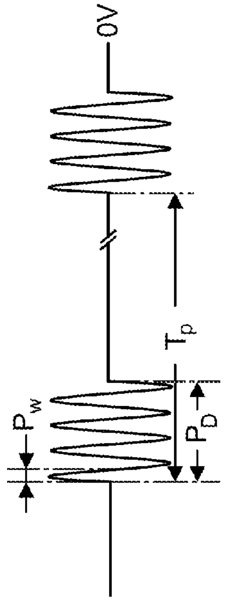
Figure 17F:
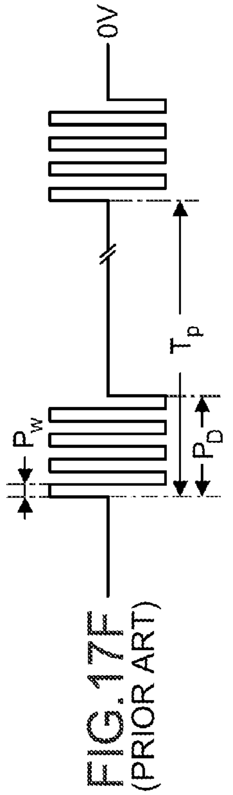
Figure 17G:
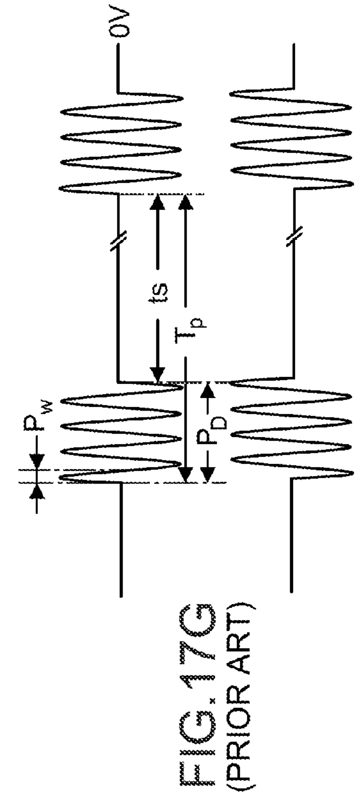

Firstly, the pulses (hereinafter referred to as target pulses) the embodiments intend to generate will be explained with reference to FIGS. 17A through 17G, and 18 through 23. The target pulses are single-ended output pulses as shown in FIGS. 17E and 17F, or a pulse obtained by band-limiting a pair of pulses having phases 180 degrees different from each other as shown in FIG. 17G. The waveform of the band-limited pulse will be explained later in further detail with reference to FIGS. 18 through 23. FIG. 17G shows a pulse signal with a pair of differential outputs, the potential difference of which is identical to the waveform shown in FIG. 17E. Focusing attention to the output potential difference as a differential signal, any value can be taken as the DC level in the period without any pulses denoted with tS in the drawing, providing the value is the same.

Although in the present specification there is explained the case of generating a waveform with the following specifications easily achievable using a complementary metal-oxide semiconductor (CMOS) process with the minimum line width of 0.18, the invention is not limited to this specific case.

Pulse interval $T_P$: any value

Carrier frequency f0: 4 GHz

Carrier pulse width PW: 125 psec

Pulse width PD: any value

Number of pulses (number of fingers) included in period PD: 4 (PD=(number of fingers)×PW)

Figure 18:
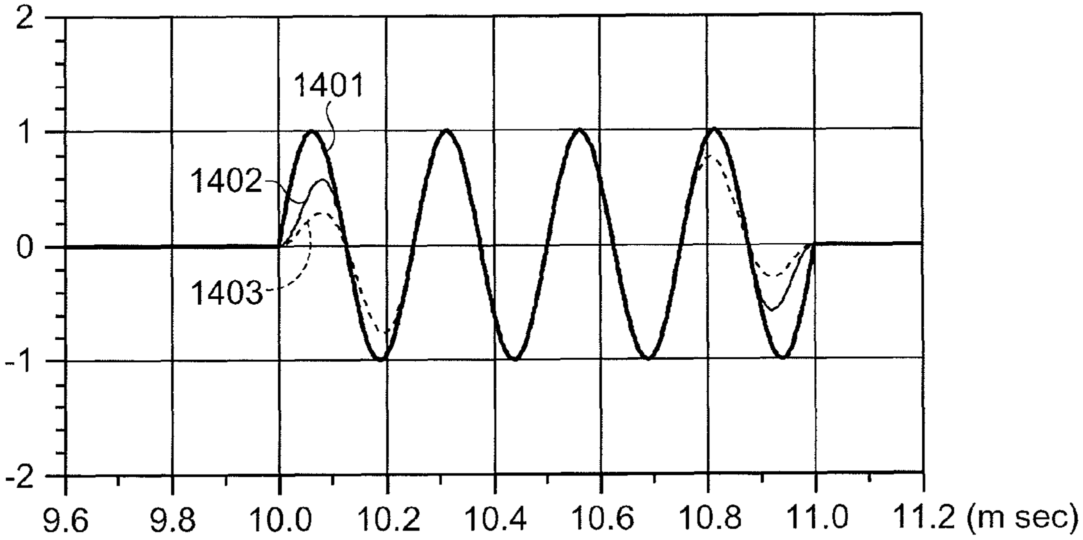
FIG. 18 is a first diagram for explaining the waveform and the spectrum of the target pulse of the embodiments of the invention.

Form of signals: A single-ended output, differential outputs, and a pair of IQ signals with differential outputs FIG. 18 is for explaining waveforms in the case of executing the band-limitation on the waveforms shown in FIGS. 17E and 17G. The waveform 1401 shown in FIG. 18 corresponds to the waveforms shown in FIGS. 17E and 17G on which no band-limitation is executed. The pulse with the specifications described above is shown as an example. In order for executing the band-limitation, the wave height values in the leading and trailing edges of the pulse are reduced to round off the pulse envelope. The waveform 1402 is a waveform obtained by modifying the original waveform to have the first and the last fingers with a wave height a half of that of the original waveform, and the waveform 1403 is a waveform obtained by modifying the original waveform to have the first and the last fingers with a wave height a third of that of the original waveform, and the second and the second last fingers with a wave height two thirds of that of the original waveform.

Figure 19:
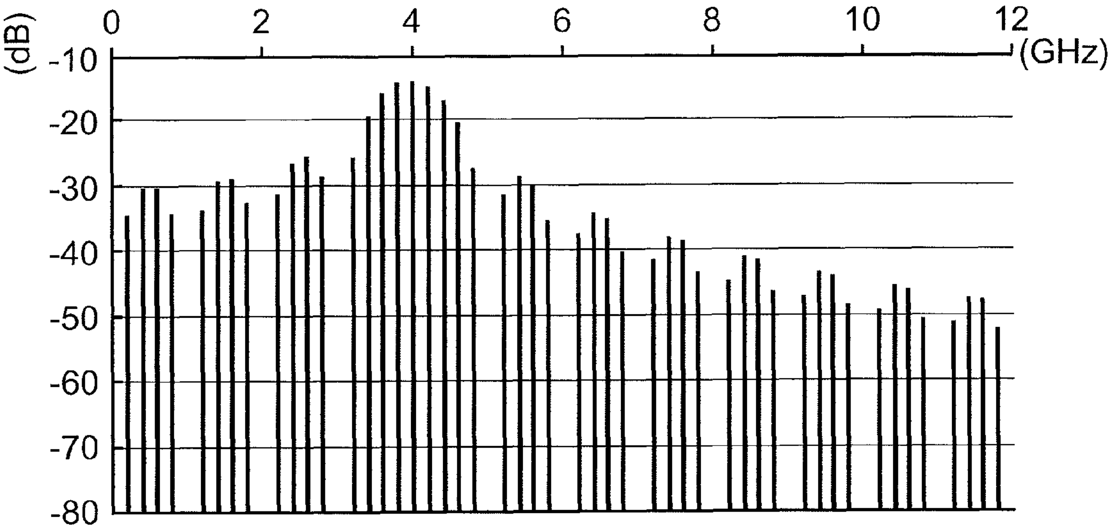
FIG. 19 is a second diagram for explaining the waveform and the spectrum of the target pulse of the embodiments of the invention.
Figure 20:
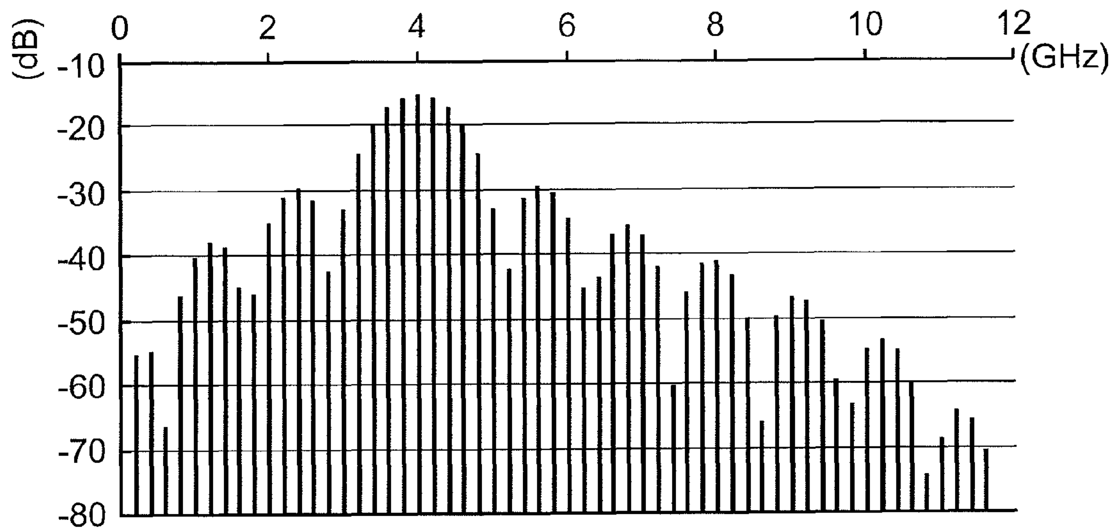
FIG. 20 is a third diagram for explaining the waveform and the spectrum of the target pulse of the embodiments of the invention.
Figure 21:
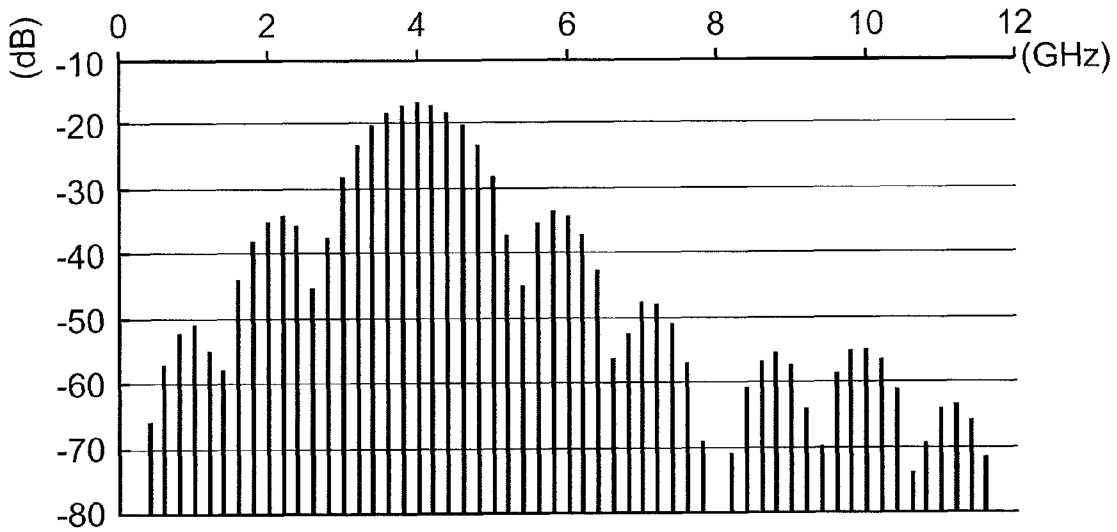
FIG. 21 is a fourth diagram for explaining the waveform and the spectrum of the target pulse of the embodiments of the invention.

FIGS. 19 through 22 are diagrams representing the spectrums of these waveforms. FIG. 19 shows the spectrum of the waveform 1401 without any band limitations, FIGS. 20, 21 show the spectrums of the waveforms 1402, 1403 with band limitations, respectively. These drawings correspond to the pulse trains obtained by repeating the single pulses shown in FIG. 18, respectively, at a repetition frequency of 200 MHz, and the spectrums are obtained as line spectrums by 200 MHz since no modulation is executed thereon. According to the spread of the spectrums of the waveforms, the main lobes of the waveforms 1402, 1403 become slightly wider in this order compared to that of the waveform 1401 without any band limitations. This is because the pulse duration becomes transiently shorter by reducing the wave height at the leading and trailing edges of the pulse for the band limitation. According to the side lobes of the spectrums, it is understood that reduction of the wave height of the leading and trailing edges of the pulse is obviously effective for the band limitation. Although the difference is a few dB at most in the first side lobe, the difference of a few dB is important and has a significant effect on building the system.

Figure 22:
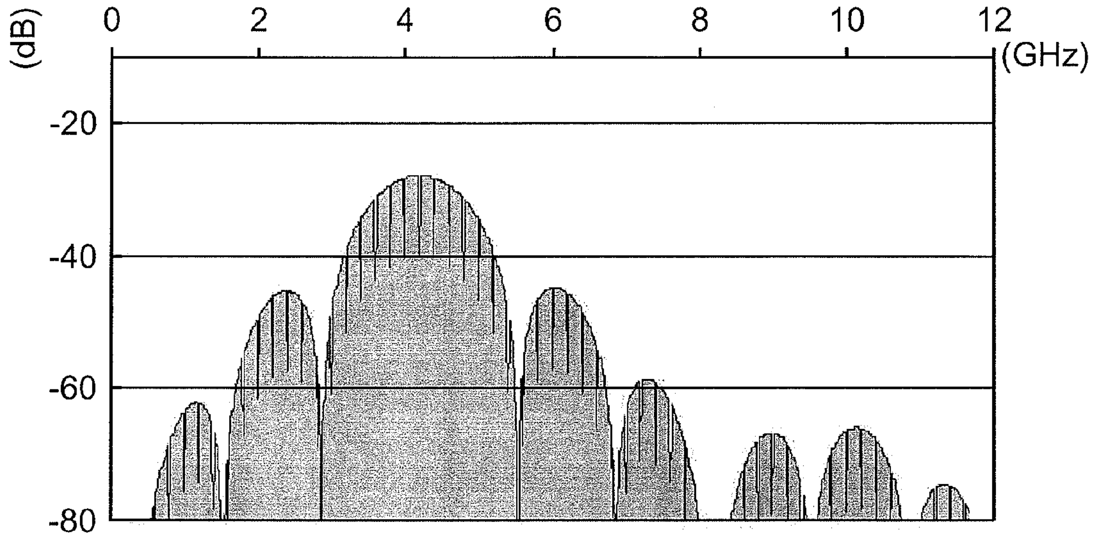
FIG. 22 is a fifth diagram for explaining the waveform and the spectrum of the target pulse of the embodiments of the invention.
Figure 23:
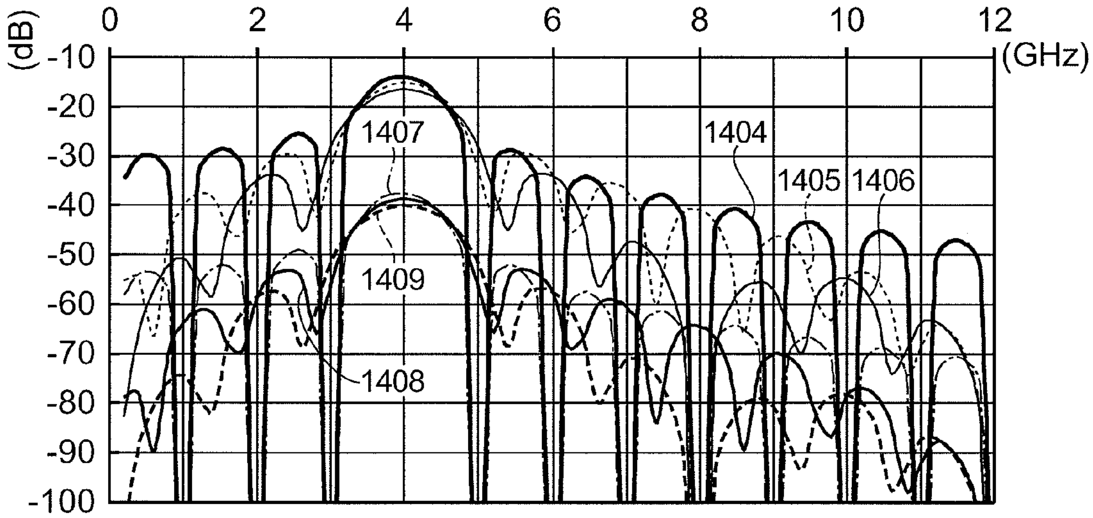
FIG. 23 is a sixth diagram for explaining the waveform and the spectrum of the target pulse of the embodiments of the invention.

FIGS. 19 through 21 show the spectrums thereof with no modulation executed thereon. FIG. 22 shows a spectrum in the case in which the Bi-Phase Modulation (BPM) is executed on the waveform 1403 with a PN code having a length of 31, as an example. By executing the modulation, the line spectrum becomes a band spectrum, and the intensity of the spectrum is also reduced. In fact, in the UWB communication, since the allowable upper limit of the spectrum is designated by a regulation, and it is not preferable that the spectrum intensity is increased with the line spectrum, a counter measure for generating the band spectrum by dithering, for example, is taken in actual use. FIG. 23 shows the spectrums of the three types of waveforms without any modulations, and the spectrum distributions in the case in which the band spectrums are made by executing the BPM with the PN code having a length of 31 as an example in order for learning the spectrum in the case in which the band spectrum is made by the measure such as dithering. It should be noted that in the drawings, the line spectrums are illustrated as envelope curves connecting only the peaks thereof, respectively. In the drawing, the reference numerals 1404, 1405, and 1406 respectively denote the spectrum envelope curves of the waveforms 1401, 1402, 1403 without the modulation, and reference numerals 1407, 1408, 1409 respectively denote the band spectrums in the case in which the modulation is executed thereon. In either cases, it is understood that the side lobe of the spectrum can be reduced by rounding off the envelope of the pulses, namely by reducing the rate of change of the envelope in the leading and trailing edges of the pulse.

First Embodiment

Figure 1:
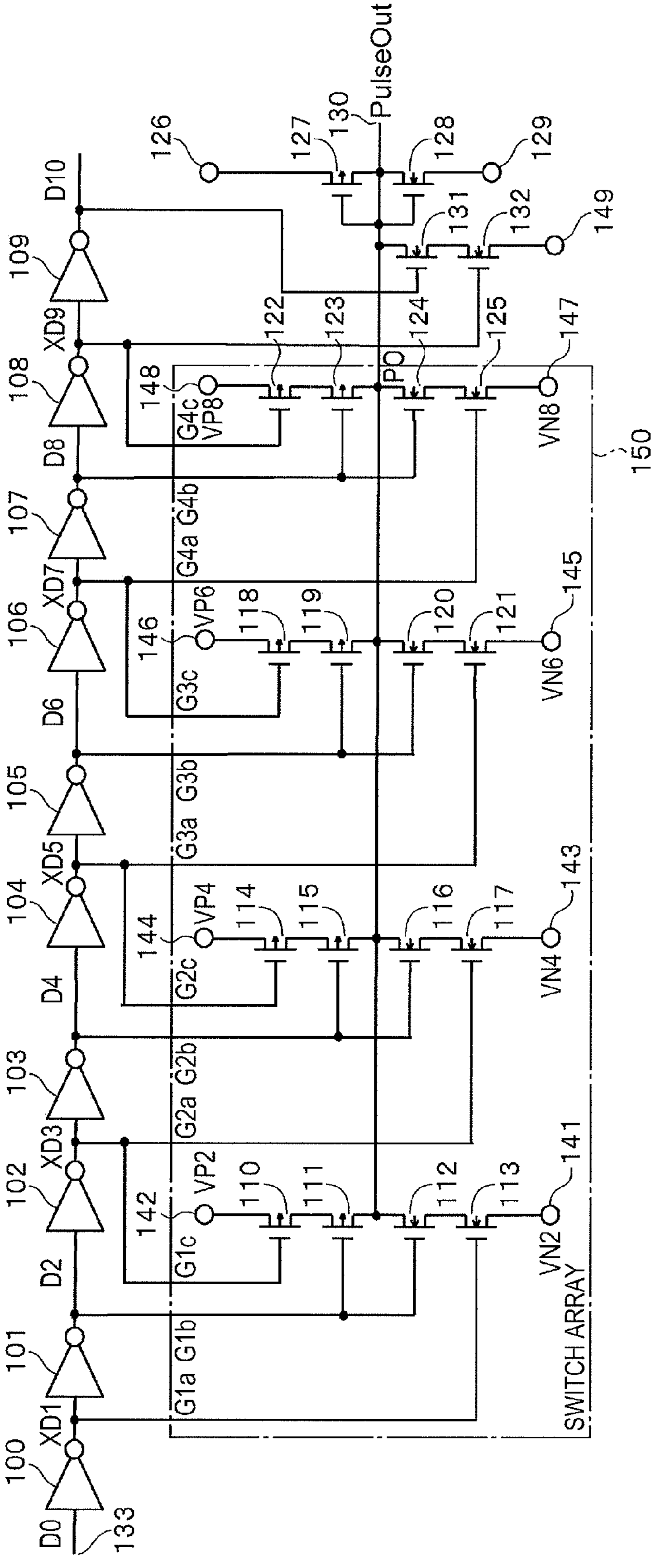
FIG. 1 is a diagram showing a pulse generation circuit of an embodiment of the invention.
Figure 3:
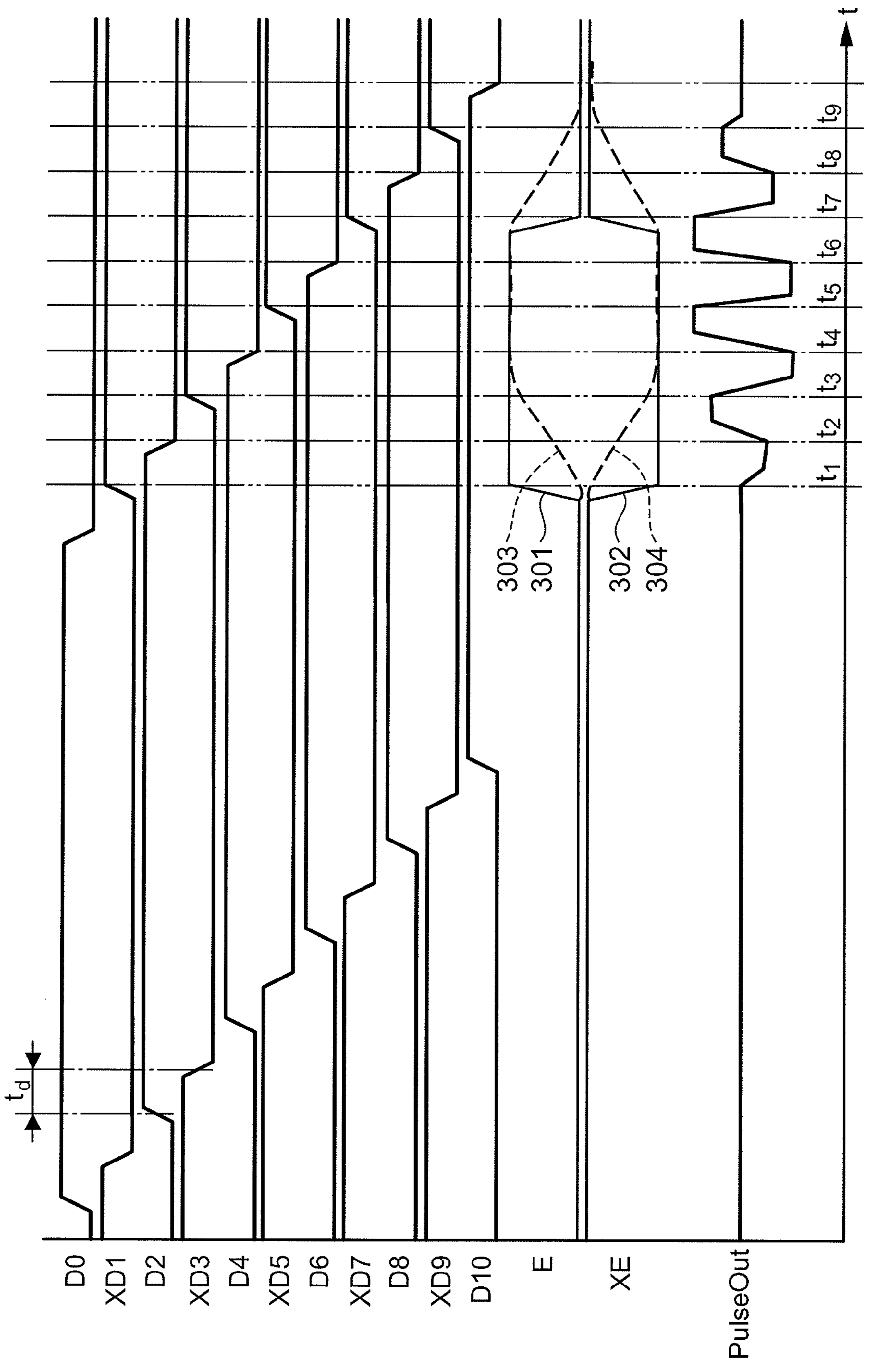
FIG. 3 is a time chart showing an operation of the pulse generation circuit of another embodiment of the invention.

FIG. 1 shows a first embodiment. FIG. 3 describes the time chart representing the operation thereof.

Figure 16:
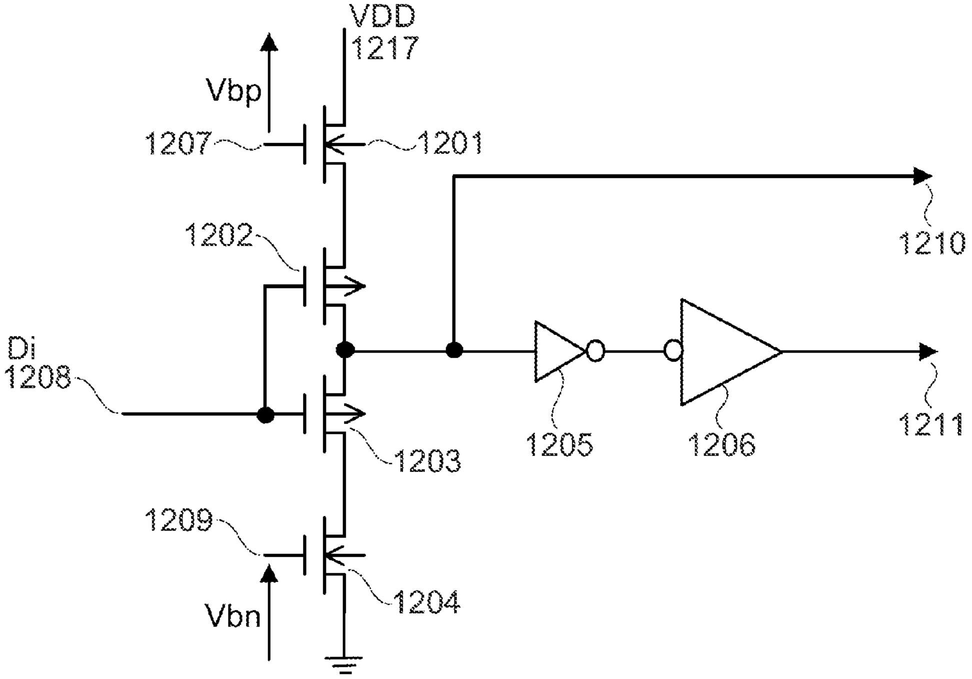
FIG. 16 is a diagram for explaining an inverter delay circuit.

The internal configuration of the inverter delay circuits 101 through 109 is substantially the same as the configuration of the inverter delay circuit used in the related art explained with reference to FIG. 16. The amount of delay of each stage of the inverter delay circuits is assumed to be adjusted to $P_W$ (125 psec in the case of the present embodiment of the invention). In the case in which the amount of delay takes this value, the target pulse described above, namely the pulse with the carrier frequency $f_0$=4 GHz (the carrier pulse width $P_W$=125 psec) can be generated. Since the inverter delay circuits 100 through 109 delay the start signal D0 while inverting the start signal D0, the outputs thereof are represented as XD1, D2, XD3, . . . , D10 with the symbol X for representing the inverted logic of the signal attached to the front of the name of each of the odd numbered signals.

In other wards, the start pulse D0 input to a terminal 133 is propagated in the delay circuits while being the delay time $t_d$ delayed and inverted in logic in every stage, and output from each of the stages as shown in XD1 through D10 of FIG. 3. Specifically, assuming that the signal applied to the input terminal 133 is positive-logic and i denotes an even number, the ith stage and the i+1th stage output XDi−1 and Di, respectively.

The circuit surrounded by the dashed line corresponds to a switch array 150, and operates as follows. N-channel transistors 112 and 113 become in the conducting state when D2 and XD1 are in the high level (H) to connect the pulse output terminal 130 to a terminal 141. The terminal 141 is provided with a power supply with a voltage value of $VN_2$ connected thereto. Therefore, when the logical product of D2 and XD1 is true, the voltage $VN_2$ is output to the pulse output terminal.

P-channel transistors 111 and 110 become in the conducting state when D2 and XD3 are in the low level (L) to connect the pulse output terminal 130 to a terminal 142. The terminal 142 is provided with a power supply with a voltage value of $VP_2$ connected thereto. Therefore, when the logical sum of D2 and XD3 is false, the voltage $VP_2$ is output to the pulse output terminal.

Similarly, N-channel transistors 116 and 117, 120 and 121, 124 and 125 become in the conducting state when Di and XDi−1 are in the high level (H) to connect the pulse output terminal 130 to terminals 143, 145, and 147, respectively. The terminal 143, 145, and 147 are respectively provided with power supplies with voltage values of $VN_i$ connected thereto. Therefore, when the logical product of Di and XDi−1 is true, the voltage $VN_i$ is output to the pulse output terminal.

P-channel transistors 115 and 114, 119 and 118, 123 and 122 become in the conducting state when Di and XDi+1 are in the low level (L) to connect the pulse output terminal 130 to terminals 144, 146, and 148, respectively. The terminal 144, 146, and 148 are respectively provided with power supplies with voltage values of $VN_i$ connected thereto. Therefore, when the logical sum of Di and XDi+1 is false, the voltage $VP_i$ is output to the pulse output terminal.

P-cannel MOS transistor 127 and N-channel MOS transistor 128 are MOS resistors for dividing the voltages applied to terminals 126 and 129, and determines the voltage (PulseOut) of the output terminal 130 when the switching circuits formed respectively of the switching transistors 110 through 125 do not connect the output terminal 130 to either $VN_i$ or $VP_i$. Further, P-channel transistors 131 and 132 are necessary for pulling the voltage of the pulse output terminal 130 back to a predetermined value from $VP_8$ when the logical product of XD9 and D10 (namely the trailing edge of the pulse to be generated) is true.

By the operation described above, the pulse output terminal is switched between VNi and Vpi in every period $t_d$. Representing the period in which the logical product of Di and XDi−1 is true as $t_{i-1}$ and the period in which the logical sum of Di and XDi+1 is false as $t_i$, as shown with the PulseOut in FIG. 3, the pulse output terminal 130 is connected to as follows.

Period $t_{i-1}$ $VN_i$

Period ti VPi

Therefore, by determining the $VN_i$, $VP_i$ so as to be the envelope curve of the pulse waveform with the band limitation, the pulse to be generated becomes automatically the pulse with the band limitation. Since any methods for determining the $VN_i$, $VP_i$ can be adopted, other setting than the setting of reducing the wave height in the leading and trailing edges of the output pulse as shown in FIG. 18 is possible, and it is possible to freely determining the spectrum characteristics. When the target spectrum is given, since the inverse Fourier transform provides the waveform on the time axis, the envelope waveform of the output pulse can be calculated from a necessary band characteristic, and by determining $VN_i$, $VP_i$ based on the calculated value, the desired band characteristic can be obtained. Further, if $VN_i$, $VP_i$ are determined by sampling the Gaussian function, it is possible to make both (the product of both) of the temporal spread of pulse and the spread on the frequency axis, namely the spread of the band become the theoretically smallest possible value.

As described above, according to the present embodiment, the pulse on which the necessary band limitation is executed can be generated with the circuit as simple as the circuit in the related art. The pulse to be generated is precise, and has a preferable characteristic even in the high-frequency band near the operation limit of the circuit components.

Second Embodiment

Figure 2:
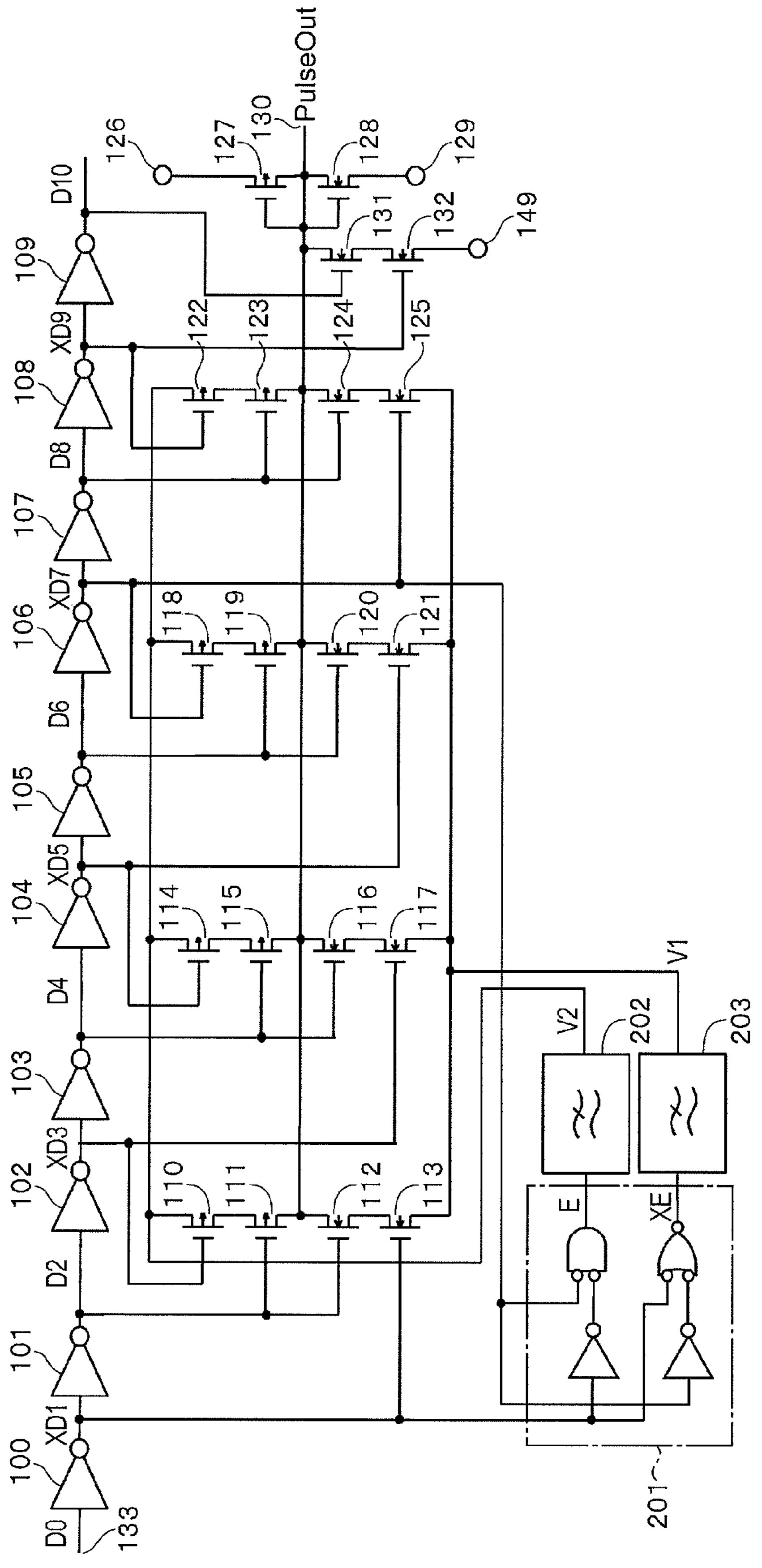
FIG. 2 is a diagram showing a pulse generation circuit of another embodiment of the invention.

FIG. 2 shows a second embodiment of the invention. FIG. 3 used commonly to the first embodiment describes the time chart representing the operation thereof. The same elements as those explained in the first embodiment will be denoted in FIG. 2 with the same reference numerals as in FIG. 1, and the explanations therefore will be omitted.

In the present embodiment, the terminals 142, 144, 146, and 148 provided with $VP_i$ connected thereto in the first embodiment are connected to each other, and provided with an output signal V2 of a band-limitation filter 202 connected thereto. Further, the terminals 141, 143, 145, and 147 provided with $VN_i$ connected thereto in the first embodiment are connected to each other, and provided with an output signal V1 of a band-limitation filter 203 connected thereto.

In the present embodiment, the signals V1, V2 described above are generated as follows. Specifically, a logic circuit 201 generates a pulse signal E and a pulse signal XE with balanced outputs corresponding to the pulse width of the pulse to be generated. These signals are formed based on the logic E=XD1*D7 and the pulse signal XE=XD1+D7 using the outputs of the inverter delay circuits (see E, XE in FIG. 3. Note that in the drawing, a diagram enlarging E, XE, and PulseOut in the amplitude direction is described for making the diagram eye-friendly).

These pulse signals E, XE are inverted in logic to each other, and have a pulse width corresponding to the pulse width of the pulse to be generated. In order for limiting the band, the signals E, XE are transmitted through the low-pass filters 202, 203 to generate the signals V2, V1, respectively. In the case in which the low-pass filters 202, 203 cause a delay, the timing is adjusted by shifting the tap of the inverter delay circuits forward. In FIG. 3, the reference numerals 303, 304 denote the signals V2, V1 described above, respectively. The switching transistors 110 through 125 switch the signals V2, V1 described above in every period $t_d$ by substantially the same operation as in the first embodiment to generate the pulse having a low wave height in the leading and trailing edges of the pulse and on which the band limitation is executed as shown in the PulseOut of FIG. 3.

According to the related technology, a band-pass filter is used on the output pulse in order for imposing the band limitation on the generated pulse. In the present embodiment, a low-pass filter, which is easy to design, is used instead of the band-pass filter. Moreover, the target frequency thereof is significantly lower compared to the passing band of the band-pass filter used in the related technology, and the fact described above makes it much easier to design, mount, and manufacture the filter. Further, since the output pulse is obtained by multiplying the carrier wave with a frequency of $1/t_d$ by the signals V1, V2 thus band-limited by the low-pass filter, an accurate pulse with the spectrum distribution having a preferable symmetrical property centered on the carrier frequency described above.

Third Embodiment

Figure 4:
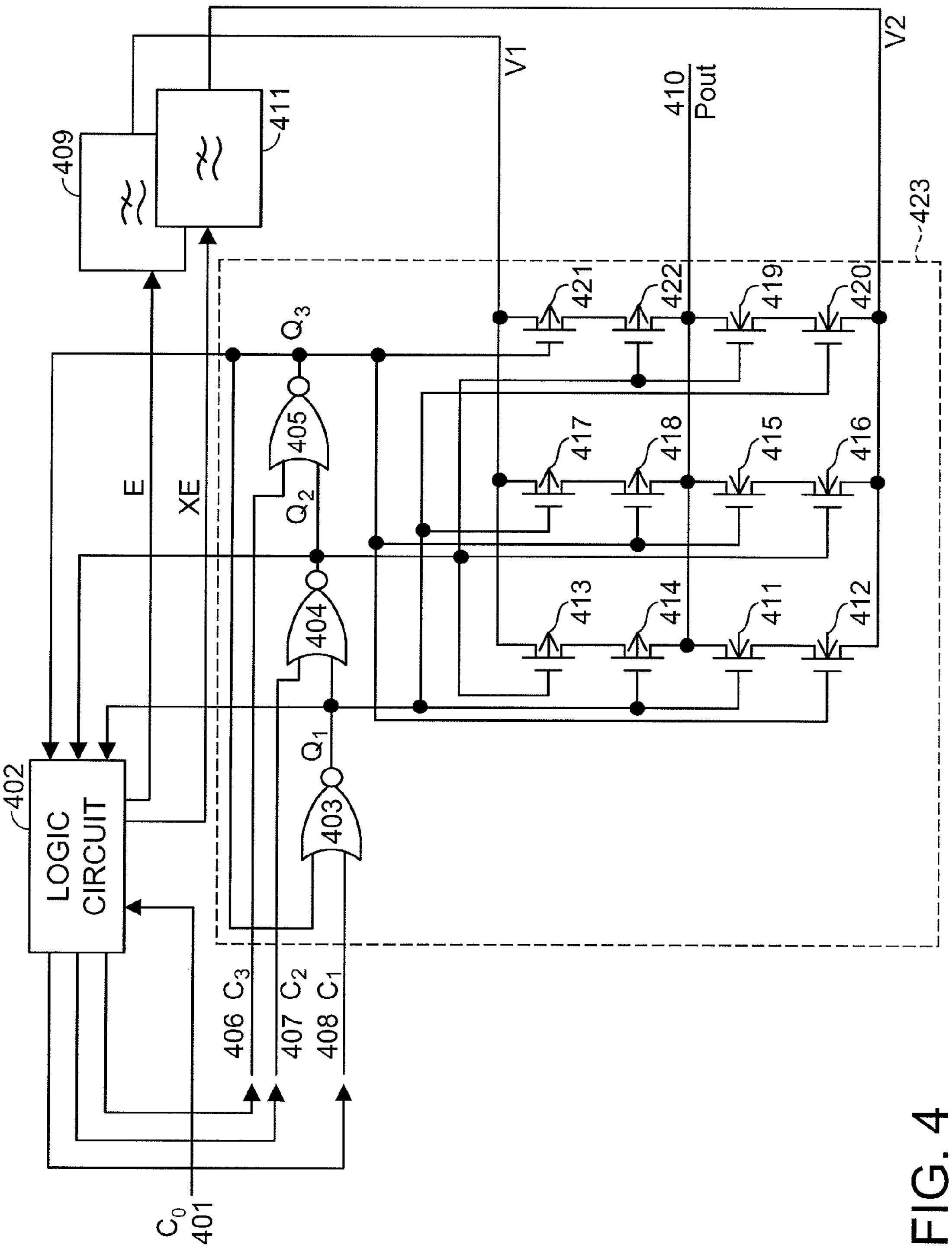
FIG. 4 is a diagram showing a pulse generation circuit of still another embodiment of the invention.
Figure 5:
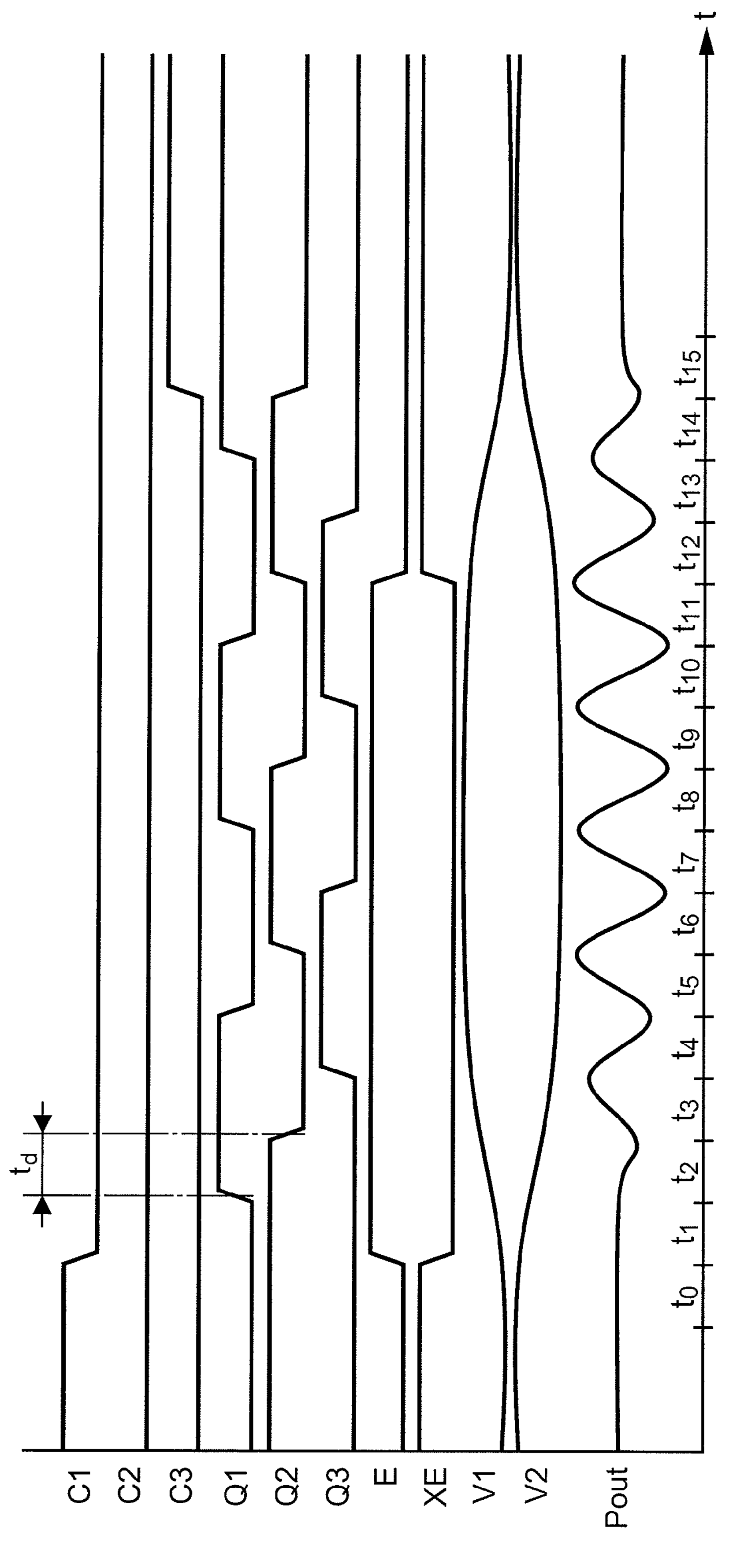
FIG. 5 is a time chart showing an operation of the pulse generation circuit of still another embodiment of the invention.

FIG. 4 shows a circuit diagram of a third embodiment, and FIG. 5 shows a time chart for explaining the operation thereof.

In the drawing, NOR circuits 403, 404, and 405 are delay circuits. The outputs of the respective NOR circuits are defined as $Q_1$, $Q_2$, and $Q_3$. One of two input terminals of the NOR circuits 403, 404, and 405 are respectively connected to the outputs $Q_3$, $Q_1$, and $Q_2$ of the NOR circuits 405, 403, and 404 to form a ring circuit. Further, the other input terminals 408, 407, and 406 of the NOR circuits 403, 404, and 405 are defined as $C_1$, $C_2$, and $C_3$, respectively. A circuit composed of switching transistors 411 through 422 connects the pulse output terminal Pout 410 to the output V1 of a low-pass filter 409 when $(Q_1+Q_2)*(Q_3+Q_1)*(Q_2+Q_3)$ is false, and connects the pulse output terminal Pout 410 to the output V2 of the low-pass filter 424 when $Q_3*Q_1+Q_2*Q_3+Q_1*Q_2$ is true.

The part surrounded by the dotted line 423 in the drawing is identical to the original circuit if $(Q_1, Q_2, Q_3)$ is replaced with $(Q_2, Q_3, Q_1)$ and $(C_1, C_2, C_3)$ is replaced with $(C_2, C_3, C_1)$, for example. Such a circuit is referred to as a circular symmetric circuit in the embodiments of the invention. Further, input/output values of the logic circuits are represented by true (H) and false (L), and the states of logical values of the circuits are abbreviated as $(Q_1, Q_2, Q_3)$=(H, L, L), for example, which denotes that $Q_1$=H, $Q_2$=L, and $Q_3$=L.

Assuming that $(C_1, C_2, C_3)$=(H, L, L) is satisfied, $(Q_1, Q_2, Q_3)$=(L, H, L) is obtained, and therefore, the P-channel switching transistor 417 and the P-channel switching transistor 418 become in the conducting state to connect the pulse output terminal Pout 410 to the output of the low-pass filter 409 (the signal V1) (the state in to of FIG. 5). When the state is changed from the present state to ($C_1$, $C_2$, $C_3$)=(L, L, L) (the state in $t_1$), the NOR circuits 403, 404, 405 become equivalent to a ring oscillation circuit with three states of inverters, and start oscillation. During the ring oscillation circuit continues the oscillation, the logic circuit explained above operates the switching transistors 411 through 422 to switch the pulse output terminal Pout 410 between the output of the low-pass filter 409, namely the signal V1, and the output of the low-pass filter 424, namely the signal V2 in every delay time $t_d$ of each of the stages of the NOR circuits 403, 404, 405, thereby generating the target pulse.

In practice, since the period in which these transistors perform switching is very short, the switching is performed before sufficiently charging the load capacitances and stray capacitances. Therefore, the waveform having a rounded shape as shown in FIG. 5 is output instead of the waveform having a square shape as PulseOut schematically shown in FIG. 3. FIG. 5 shows the waveforms closer to real waveforms.

Subsequently, when setting either one of ($C_1$, $C_2$, $C_3$) to H, the ring oscillation circuit stops the oscillation to stop outputting the pulse, and at this moment, either one of the pairs of switching transistors 413 and 414, 417 and 418, and 421 and 422 simultaneously become in the conducting state to fix the voltage of the pulse output terminal Pout 410 at V1, namely the output voltage of the low-pass filter 409 ($t_{15}$ of FIG. 5). Therefore, this circuit is capable of generating a pulse having an arbitrary length of continuation time.

Consequently, it is necessary to appropriately select the value of V1 in the holding state. In the holding state, namely prior to the period to of FIG. 5, it is arranged to make the values of the signals E, XE become Vc, and to make the output voltages of the low-pass filters 409, 424, namely V1, V2 become Vc. By setting the voltage level of the signal E, when outputting the pulse, to the voltage level Vp higher than Vc described above, setting the voltage level of the signal XE to the voltage Vn lower than Vc, and setting the Vc to satisfy Vc=(Vp+Vn), the pulse to be obtained becomes an accurate pulse without including a DC component. It should be noted that although it is attempted to make the voltage of the output become V1 (=Vc) using the P-channel switching transistors in the holding state in the present embodiment, if distortion is caused in the output waveform by an imbalance between the P- and N-channels, the imbalance can be corrected by appropriately adjusting Vc, Vp, and Vn.

In response to the pulse start signal $C_0$ input to a start signal terminal 401, the logic circuit 402 sets ($C_1$, $C_2$, $C_3$) to (L, L, L) for starting the pulse generation, thereby starting the oscillation of the ring oscillation circuit to generate the pulse. At the time point when a predetermined pulse length is achieved, signals are output again to ($C_1$, $C_2$, $C_3$) so as to stop the oscillation of the ring oscillation circuit to stop the pulse generation. At the same time, the logic circuit 402 outputs the differential signal E, XE having a time duration corresponding to the pulse continuation time to the low-pass filters 409, 424. It is needless to say that in the case in which the low-pass filters 409, 424 cause a delay in the output, it is generated the delay time earlier to correct the delay.

The case in which ($C_1$, $C_2$, $C_3$) is set to (L, L, L) corresponds to the period of operating the pulse generation, and in the other cases the operation of the pulse generation is stopped. Therefore, although it seems that control of ($C_1$, $C_2$, $C_3$) has considerable freedom, the reality is different. When controlling the circuit using only either one of the terminals of ($C_1$, $C_2$, $C_3$), the number of the pulse fingers is problematically limited to multiples of three in the case of forming the three-stage ring oscillation circuit as is the case with the present embodiment.

It is now assumed that the logic circuit 402 outputs ($C_1$, $C_2$, $C_3$)=(H, L, L) as initial values. In this case, ($Q_1$, $Q_2$, $Q_3$)=(L, H, L) is obtained. When the pulse start signal $C_0$ is input to the terminal 401 in this condition, the logic circuit 402 generates ($C_1$, $C_2$, $C_3$)=(L, L, L).

In conjunction therewith, the ring oscillation circuit composed of the NOR circuits 403, 404, and 405 starts oscillation, and starts outputting the pulse from the terminal Pout 410. In order for obtaining the pulse with a desired number of fingers, the logic circuit 402 sets the signals to ($C_1$, $C_2$, $C_3$). Specifically, as shown in FIG. 5, in the case of generating the pulse with the number of fingers of, for example, 3n+1 (n denotes an integer), the logic circuit 402 monitors the state of $Q_1$, $Q_2$, and $Q_3$, and outputs ($C_1$, $C_2$, $C_3$)=(L, L, H) to stop generation of the pulse when $Q_3$ becomes in L.

The logic circuit 402 holds this state, and waits for the next pulse start signal $C_0$ being input to the terminal 401. Although in the initial state described above the logic circuit 402 is waiting for the pulse start signal $C_0$ with ($C_1$, $C_2$, $C_3$)=(H, L, L), in this case it waits for the pulse start signal $C_0$ with ($C_1$, $C_2$, $C_3$)=(L, L, H). Since the circuit is the circular symmetric circuit, by replacing $C_1$, $C_2$, $C_3$ with $C_2$, $C_3$, $C_1$, respectively, the subsequent operations are thought to be the same.

Specifically, the logic circuit 402 generates ($C_1$, $C_2$, $C_3$)=(L, L, L) to start generation of the pulse when the next $C_0$ is input in this condition, and outputs ($C_1$, $C_2$, $C_3$)=(L, H, L) to stop generation of the pulse when $Q_1$ becomes in L, thereby generating the pulse with the same number of pulse fingers.

As described above, the control becomes easy by using the symmetrical property of the circuit, and further, it becomes possible to easily design the logic circuit 402 considering the circular symmetric property.

According to the present embodiment, the UWB pulse signal with arbitrary length and on which the band limitation is executed can be generated with a simple circuit.

Fourth Embodiment

Figure 6:
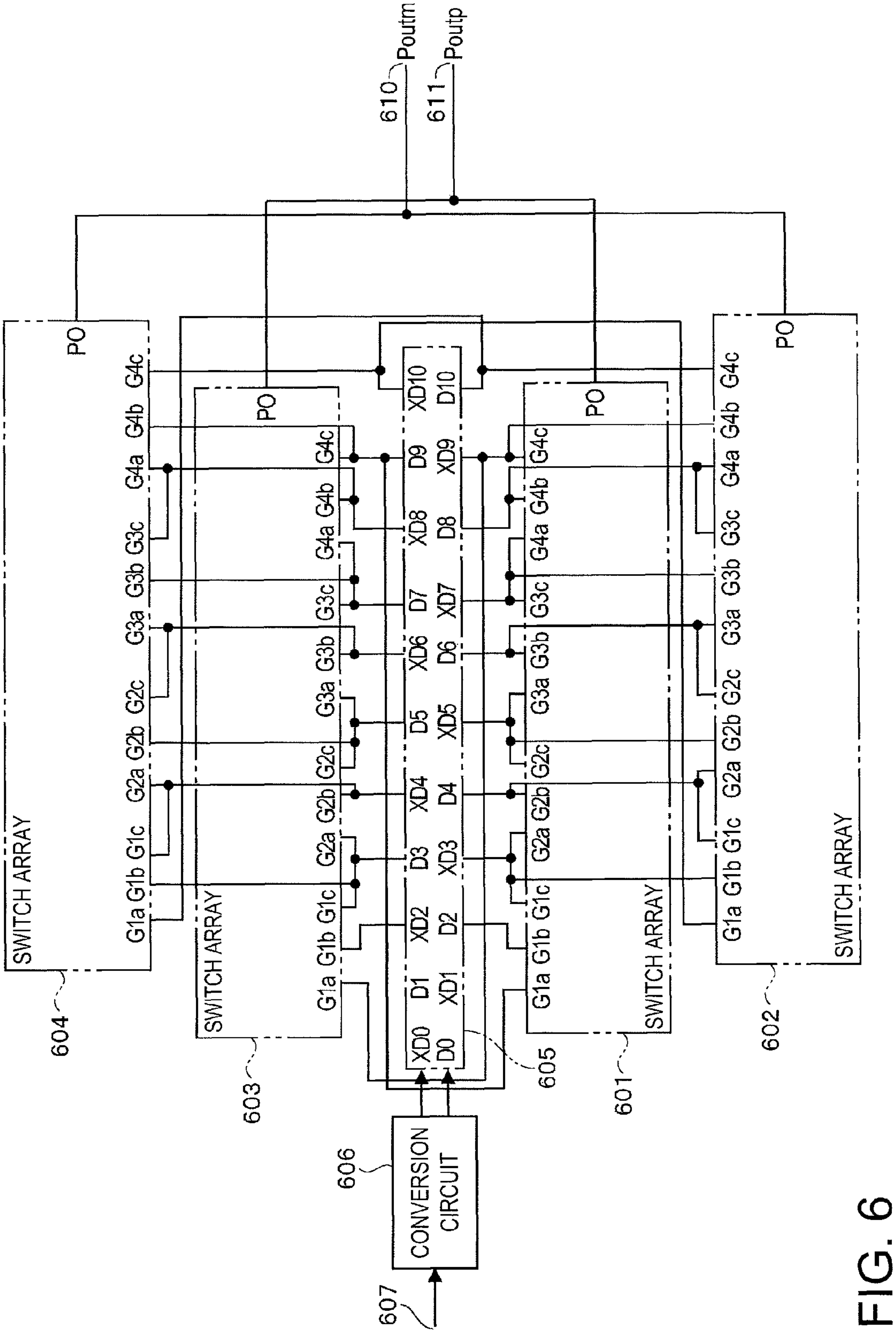
FIG. 6 is a diagram showing a pulse generation circuit of still another embodiment of the invention.
Figure 8:
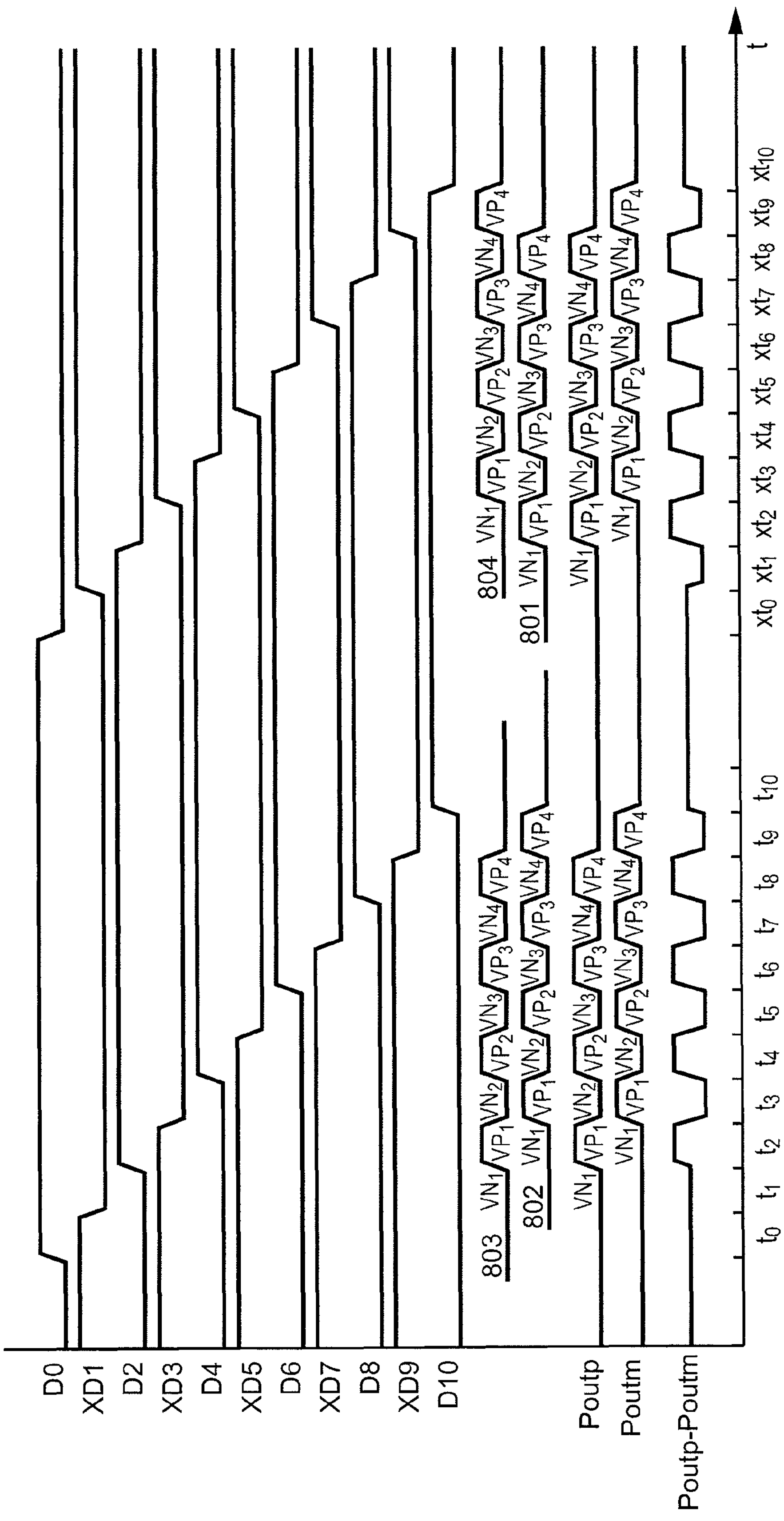
FIG. 8 is a time chart showing an operation of the pulse generation circuit of still another embodiment of the invention.

As the fourth embodiment, an example of the circuit for generating the pulse obtained by imposing the band limitation on the pulse signal with differential outputs explained with reference to FIG. 17G configured based on the invention is presented. FIG. 6 shows the circuit diagram of the circuit, and FIG. 8 shows a time chart for explaining the operation thereof.

A start signal input to a terminal 607 starts the pulse. A conversion circuit 606 is a circuit for receiving the start signal and converting the start signal into a bi-phase signal, and a differential inverter delay circuit 605 is started.

Figure 7:
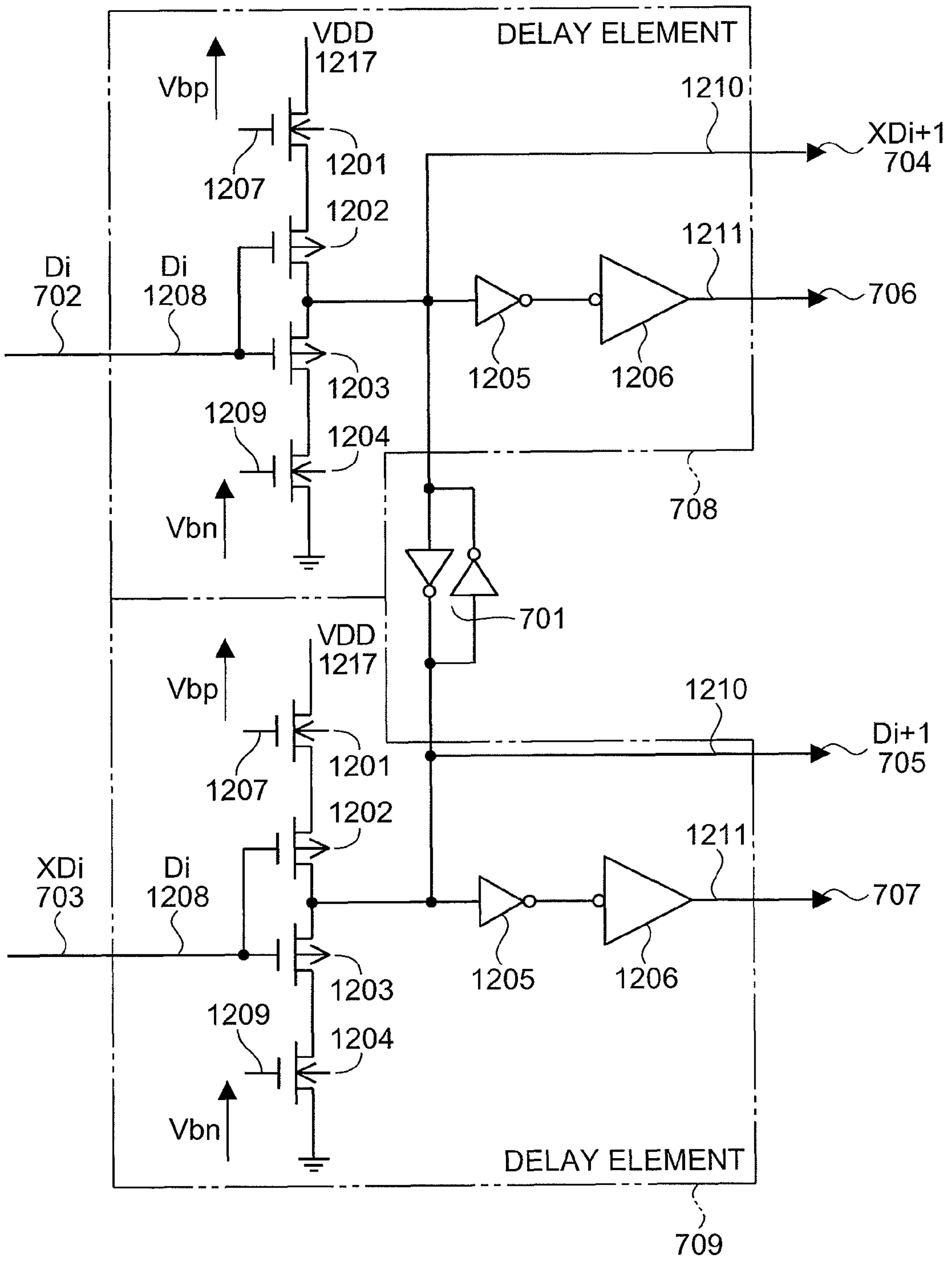
FIG. 7 is a diagram for explaining an inverter delay circuit used for an embodiment of the invention.

In the differential inverter delay circuit 605, a delay element of each stage can take the circuit configuration as shown in FIG. 7. FIG. 7 is a diagram showing a configuration example of each stage of the delay circuit 605, which can be obtained by arranging delay elements 708, 709 each corresponding to the delay element of the inverter delay circuits shown in FIG. 16 in two rows, and coupling the delay elements 708, 709 with a cross-coupled inverter 701. Since individual circuits have already been explained, the individual circuits are denoted with the same reference numerals, and the explanations therefor will be omitted.

The input terminals 1208 of the delay elements 708, 709 respectively become input terminals Di 702, XDi 703 in the ith stage, and are driven by signals having phases opposite to each other. The outputs 1210 are connected to the delay element of the subsequent stage as XDi+1 704, Di+1 705, and at the same time, become output terminals 706, 707 of the signals each taken out therefrom with the small buffer circuit 1205, enhanced in drive capacity with the large buffer circuit 1206, and for driving the switch arrays, respectively. In the following explanations, it is assumed that the buffer circuits 1205, 1206, which cause a delay, are omitted, and that the same signal names XDi+1 and Di+1 are also used as the signal names of the signals for driving the switch arrays.

When the differential inverter delay circuit 605 is simultaneously started by the conversion circuit 606 with the signals D0, XD0 the phase is inverted, ten delayed signals such as XD1, D2, . . . , D10 shown in FIG. 8 are obtained while having the delay of $t_d$ and inverted in phase, and there are also obtained further ten delayed signals D1, XD2, . . . , XD10 as the inverted signals thereof. In FIG. 8, the signals D1, XD2, . . . , XD10 are omitted.

The internal configuration of each of the switch arrays 601, 602, 603, and 604 is the same as the switch array 150 corresponding to the part surrounded by the dashed line in FIG. 1. In other words, it is composed of the switch array formed of the transistors 111 through 125 and the power supply terminals 141 through 148 provided with the predetermined voltages $VN_i$, $VP_i$ (i denotes an even number. In the present embodiment, i denotes an even number satisfying $2 \leq i \leq 8$, for example) connected thereto. Assuming that k denotes an integer, when gate terminals Gka, Gkb of each of the switch arrays are simultaneously in H, an output terminal PO is connected to $VN_{2k}$, while the gate terminals Gkb, Gkc are simultaneously in L, the output terminal PO is connected to $VP_{2k}$. The switch arrays are provided with the signals as shown in Table 1.

neously in L, namely the logical product of Di−1 and XDi is true (in the period $xt_{i+1}$) (denoted with the reference numeral 802 in FIG. 8. It should be noted that although the wave height of each finger is proportional to $VN_i$, $VP_i$, the waveform is shown with the same wave height and the actual wave heights are described with characters in the drawing). Here, i denotes an even number satisfying $4 \leq i \leq 8$.

Further, the switch array 603 outputs the voltage level $VN_i$ to the pulse output terminal PO when XD9 and XD2 are simultaneously in H, namely the logical product of XD9 and XD2 is true (from the period $xt_9$ to the period $t_1$ in FIG. 8) and when the logical product of Di−1 and XDi is true, namely in the period $t_{i-1}$ in FIG. 8, and outputs the voltage level $VP_i$ to the pulse output terminal PO when XDi−2 and Di−1 are simultaneously in L, namely the logical product of Di−2 and XDi−1 is true (in the period $t_{i-1}$) (denoted with the reference numeral 803 in FIG. 8. It should be noted that although the wave height of each finger is proportional to $VN_i$, $VP_i$, the waveform is shown with the same wave height and the actual wave heights are described with characters in the drawing). Here, i denotes an even number satisfying $4 \leq i \leq 8$.

Further, the switch array 604 outputs the voltage level $VN_i$ to the pulse output terminal PO when D10 and D3 are simultaneously in H, namely the logical product of D10 and D3 is true (from the period $t_{10}$ to the period $xt_2$ in FIG. 8) and when the logical product of XDi and Di+1 is true, namely in the period $xt_i$ in FIG. 8, and outputs the voltage level $VP_i$ to the pulse output terminal PO when Di−1 and XDi are simultaneously in L, namely the logical product of XDi−1 and Di is true (in the period $xt_i$) (denoted with the reference numeral 804 in FIG. 8. It should be noted that although the wave height of each finger is proportional to $VN_i$, $VP_i$, the waveform is

TABLE 1

|  | G1a | G1b | G1c | G2a | G2b | G2c | G3a | G3b | G3c | G4a | G4b | G4c |
|---|---|---|---|---|---|---|---|---|---|---|---|---|
| Switch array 601 | D9 | D2 | XD3 | XD3 | D4 | XD5 | XD5 | D6 | XD7 | XD7 | D8 | XD9 |
| Switch array 602 | XD10 | XD3 | D4 | D4 | XD5 | D6 | D6 | XD7 | D8 | D8 | XD9 | D10 |
| Switch array 603 | XD9 | XD2 | D3 | D3 | XD4 | D5 | D5 | XD6 | D7 | D7 | XD8 | D9 |
| Switch array 604 | D10 | D3 | XD4 | XD4 | D5 | XD6 | XD6 | D7 | XD8 | XD8 | D9 | XD10 |

According to the connection shown in Table 1, the switch array 601 outputs the voltage level $VN_i$ to the pulse output terminal PO when D9 and D2 are simultaneously in H, namely the logical product of D9 and D2 is true (from the period $t_9$ to the period $xt_1$ in FIG. 8) and when the logical product of XDi−1 and Di is true, namely in the period $xt_{i-1}$ in FIG. 8, and outputs the voltage level $VP_i$ to the pulse output terminal PO when Di−2 and XDi−1 are simultaneously in L, namely the logical product of XDi−2 and Di−1 is true (in the period $Xt_i$) (denoted with the reference numeral 801 in FIG. 8. It should be noted that although the wave height of each finger is proportional to $VN_i$, $VP_i$, the waveform is shown with the same wave height and the actual wave heights are described with characters in the drawing). Here, i denotes an even number satisfying $4 \leq i \leq 8$.

Similarly, the switch array 602 outputs the voltage level $VN_i$ to the pulse output terminal PO when XD10 and XD3 are simultaneously in H, namely the logical product of XD10 and XD3 is true (from the period $xt_{10}$ to the period $t_2$ in FIG. 8) and when the logical product of Di and XDi+1 is true, namely in the period $t_i$ in FIG. 8, and outputs the voltage level $VP_i$ to the pulse output terminal PO when XDi−1 and Di are simultashown with the same wave height and the actual wave heights are described with characters in the drawing). Here, i denotes an even number satisfying $4 \leq i \leq 8$.

Further, the output PO of the switch array 601 and the output PO of the switch array 603 are connected in a wired-OR manner to provide a pulse output terminal Poutp 611 of one of the differential outputs, and the output PO of the switch array 602 and the output PO of the switch array 604 are connected in a wired-OR manner to provide a pulse output terminal Poutm 610 of the other of the differential outputs.

The pulse output using the connection described above becomes a pulse on which the band limitation is executed by setting the values $VN_i$, $VP_i$ of the voltage of the power supplies connected inside each of the switch arrays 601, 602, 603, and 604 to predetermined values. Specifically, the wave height of finger is set to smaller in the leading and trailing edges of the output pulse. In the present embodiment, the absolute values of $VN_1$, $VP_1$, $VN_4$, $VP_4$ are set to be smaller than the absolute values of $VN_2$, $VP_2$, $VN_3$, $VP_3$.

Although the explanations are made assuming that the values $VN_i$, $VP_i$ of the power supply voltages connected inside each of the switch arrays 601, 602, 603, and 604 are common values, it is also possible to set different power supply voltages for every switch array. According to this arrangement, the freedom of setting is further enhanced to make detailed setting possible.

Further, it is also possible to set either one of $\{VN_i\}$ and $\{VP_i\}$ with common voltages. According to this arrangement, the number of power supplies required therefor can be reduced. Also in this case, considering Poutp−Poutm as the final differential signal, the target pulse on which the band limitation is executed can similarly be generated.

In the case of taking the connection described above, the switch array 601 for generating the pulse train in response to a falling edge of D0 (in the periods $xt_2$ through $xt_8$) and the switch array 603 for generating the pulse train in response to a falling edge of XD0 (in the periods $t_2$ through $t_8$) are completely symmetric from a viewpoint of circuit. Further, the switch array 604 for generating the pulse train in response to the falling edge of D0 (in the periods $xt_3$ through $xt_9$) and the switch array 602 for generating the pulse train in response to the falling edge of XD0 (in the periods $t_3$ through $t_9$) are completely symmetric from a viewpoint of circuit. In other words, if the terminal names XDi of the inverter delay circuit are counterchanged with Di (i denotes an integer satisfying $0 \leqq i \leqq 10$) in FIG. 3, the inverter delay circuit is identical to the original circuit. Therefore, the switch arrays 601 and 603 or the switch arrays 602 and 604 generate completely the same pulse waveforms in response to a rising edge or a falling edge of D0, XD0. By forming the circuits carefully on at least the same semiconductor substrate with a pattern layout having good symmetry, the pulses generated by the respective circuits become to have the substantially the same waveform with a good symmetric property. Further, the connection of the switch array 602 or the switch array 604 becomes identical to the connection of the switch array 601 or the switch array 603 by changing the terminal names of the inverter delay circuits connected thereto from Di to XDi−1 or from XDi to Di−1, which forms substantially the same circuit topology. Therefore, substantially the same pulses with good symmetric property can be generated although the pulse waveforms generated by these circuits are shifted by $t_d$ in the generation time.

By connecting the output PO of the switch array 601 and the output PO of the switch array 603 in a wired-OR manner to provide a pulse output terminal Poutp 611 of one of the differential outputs, and connecting the output PO of the switch array 602 and the output PO of the switch array 604 in a wired-OR manner to provide a pulse output terminal Poutm 610 of the other of the differential outputs, the difference between these terminals Poutp−Poutm becomes a pulse with a good symmetric property as shown in FIG. 8. It should be noted that although the pulse output waveform considering the load capacitance is omitted in the drawing, it is conceivable that the symmetry is obviously maintained even in the case in which a heavy capacitive load is connected thereto.

In the present embodiment, the transistors 127, 128 for determining the intermediate level used in the first embodiment can be eliminated, and therefore, the leakage current caused by this part can be eliminated, thus reduction of the power consumption becomes possible. Further, since the switching element preferably driven in a period a half of $t_d$ such as the transistors 131, 132 is not included, the circuit design becomes easier. Further, although the ten stages of inverter elements are required in the first embodiment, the nine stages are enough for the present embodiment, thus the number of elements used therein can slightly be reduced (It should be noted that the outputs D1, XD1 of the first stage are not used. The first can be eliminated).

It should be noted that although the stage numbers of the inverter delay circuits is provided sequentially from one in the explanations described above, what is important is the order and the logic values of switch changing operations, and setting values of the $VN_i$, $VP_i$, the outputs of the inverter delay circuits can be provided with the stage numbers started from an arbitrary number. Further, i denotes an even number within a predetermined range corresponding to the arbitrary number. In the control of the switches, it is not required to use all of the outputs of the inverter delay circuits, and it is also possible to control the switches with a predetermined different logic in the anterior and posterior areas of the pulse.

Further, although it is also possible to take different expressions from those described above in the positive logic or the negative logic according to the Boolean-algebraic theorem, these are all equivalent, and therefore, such equivalent circuits should obviously be included in the appended claims.

As described above, according to the present embodiment, the pulse generation becomes possible every time inversion of the inverter delay circuits is caused in response to inversion of the start signal. Thus, the pulse is generated every inversion of the inverter delay circuits consuming a most part of the power consumption of the pulse generation circuit, and it becomes possible to minimize the power consumption per every pulse thus generated. Moreover, the differential pulses to be generated are precise and band-limited, and have preferable characteristics, even in the high-frequency band near the operation limit of the circuit components.

Fifth Embodiment

Figure 9:
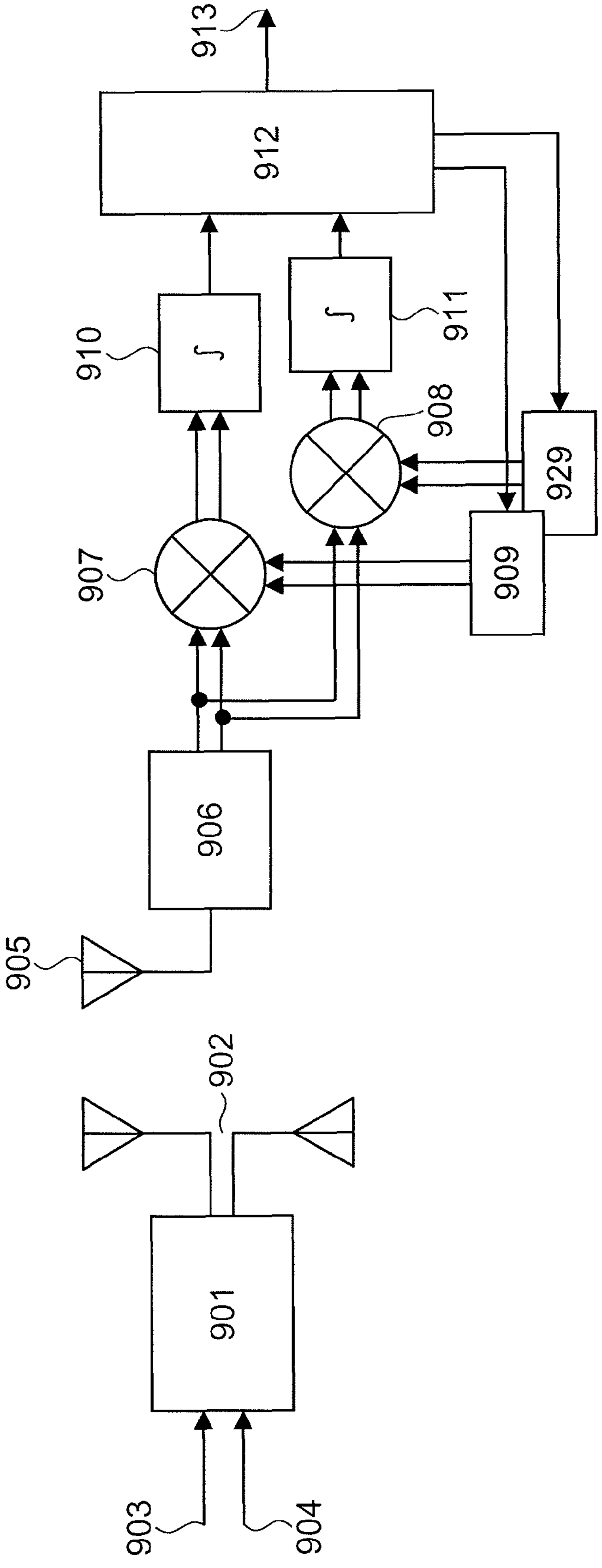
FIG. 9 is a first diagram showing a UWB communication device of an embodiment according to the invention.
Figure 10:
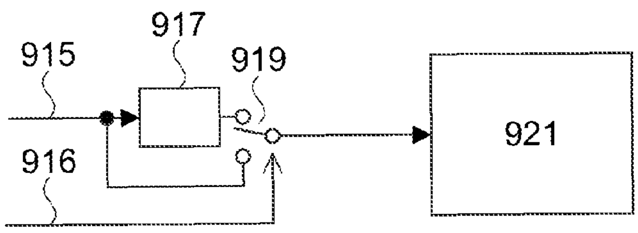
FIG. 10 is a second diagram showing the UWB communication device of the embodiment according to the invention.
Figure 11:
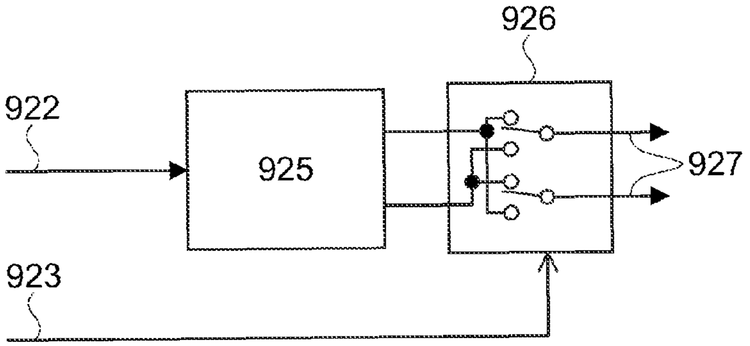
FIG. 11 is a third diagram showing the UWB communication device of the embodiment according to the invention.
Figure 12:
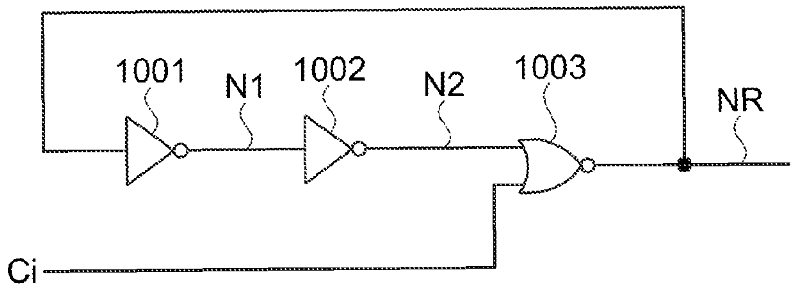
FIG. 12 is a diagram showing a pulse generation circuit of the related art.
Figure 13:
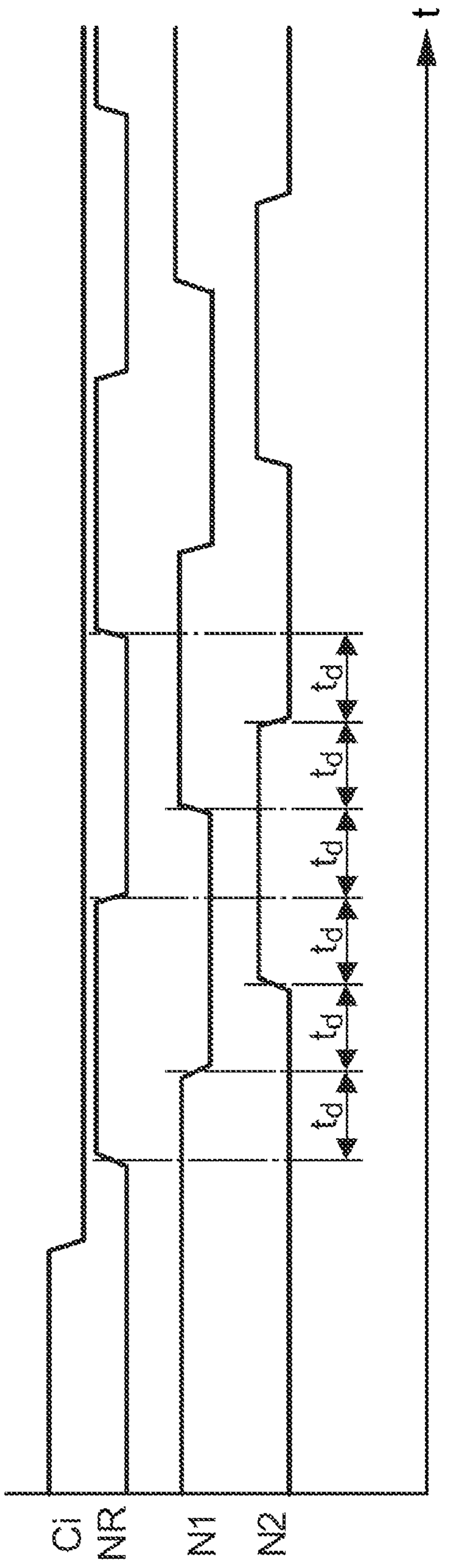
FIG. 13 is an operational time chart of the pulse generation circuit of the related art.
Figure 14:
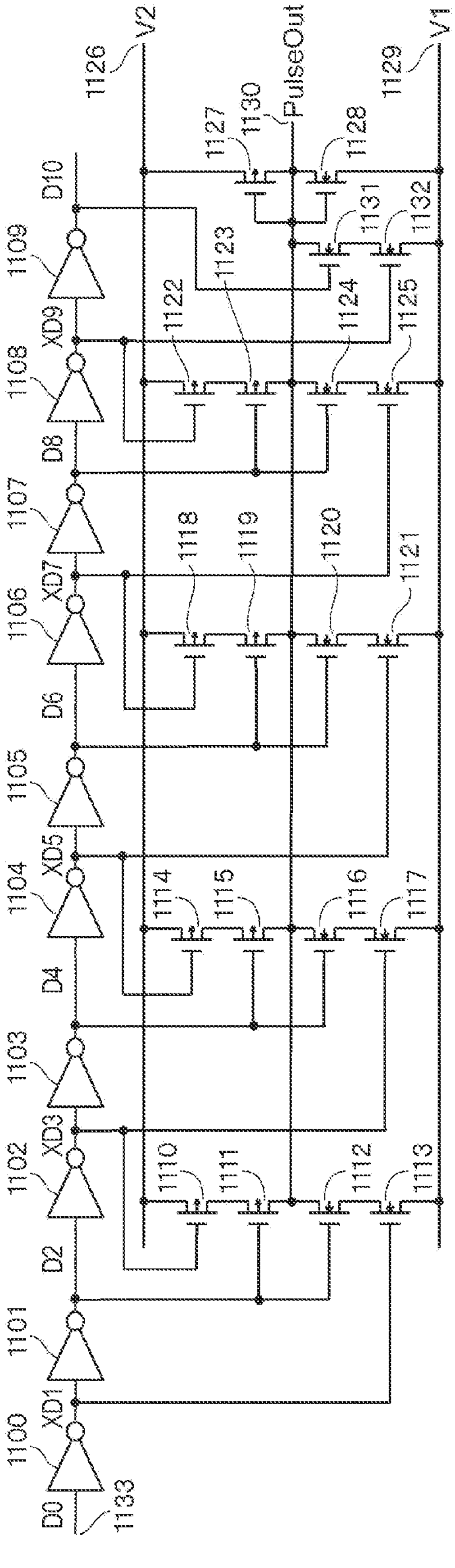
FIG. 14 is a diagram showing another pulse generation circuit of the related art.
Figure 15:
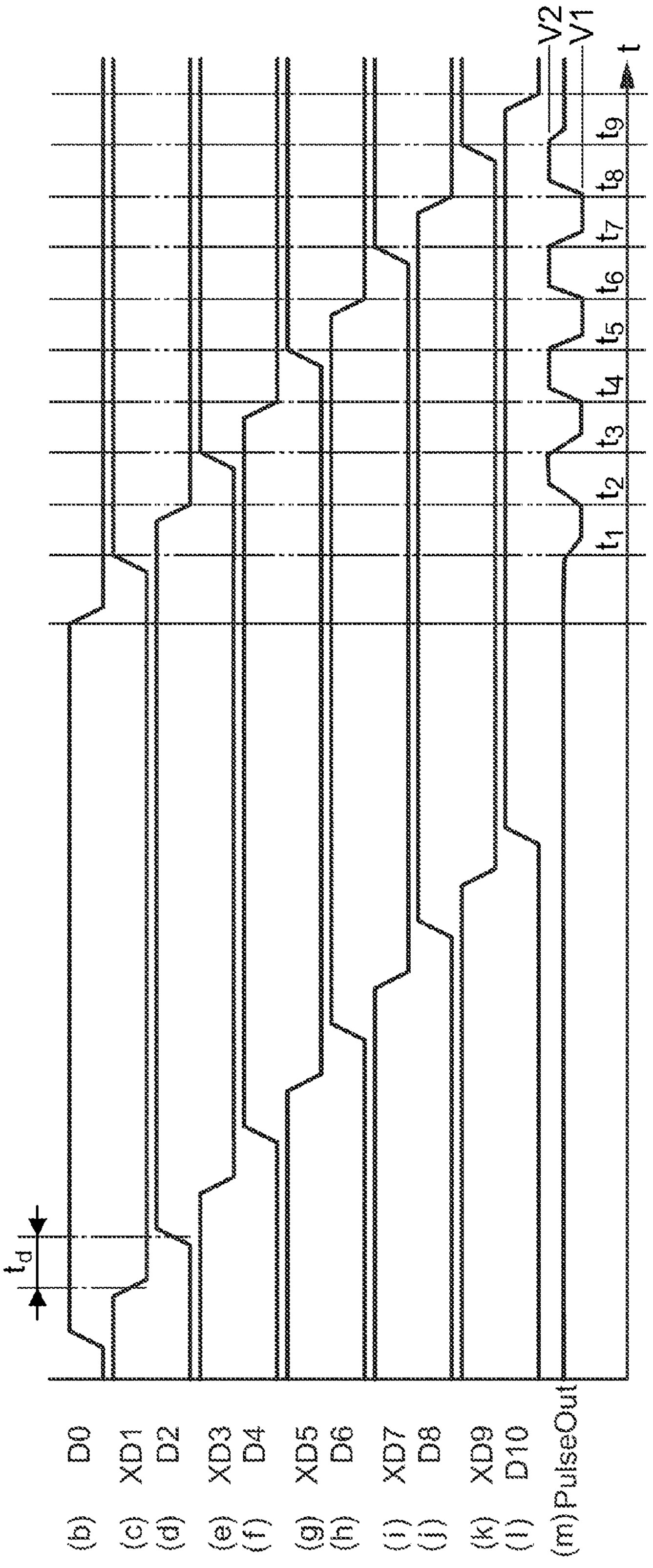
FIG. 15 is an operational time chart of another pulse generation circuit of the related art.

FIGS. 9 through 11 are diagrams for explaining substantial parts of an electronic device using any one of the pulse generation circuits according to the first through fourth embodiments, and show an example of the case in which the invention is applied to a UWB communication device.

A UWB transmission circuit 901 includes one of the pulse generation circuits shown in FIGS. 1, 2, 4, and 6. A terminal 903 is a terminal for inputting the start signal, and a terminal 904 is an input terminal for the data to be transmitted. A modulation is executed on the pulse to be generated in accordance with a signal input to the terminal 904, and the method of the modulation will be described later.

The pulse generation circuit of the fourth embodiment (FIG. 6) has two output terminals to generate differential pulse signals. Therefore, the transmitter using this pulse generation circuit capable of driving a balanced antenna. Although the case in which the transmitter drives a balanced antenna 902 is exemplified in FIG. 9, it is also possible to generate the pulse with a single-ended output using one of the pulse generation circuits according to the first, second, and third embodiments (FIGS. 1, 2, and 4) to drive an unbalanced antenna such as a monopole antenna.

As the modulation method, the Bi-Phase Modulation (BPM) of a pulse for modulating the pulse by switching the polarity of the pulse to be output along the value of the transmission data input to the input terminal 904, the Pulse Position Modulation (PPM) for connecting delay circuit to the start signal and switching the delay time along the transmission data, and so on can be adopted.

FIG. 10 shows the modulation circuit of the PPM. A terminal 915 is a terminal for inputting the start signal. A signal delayed by a delay circuit 917 and a direct signal without passing through the delay circuit 917 are formed from the input signal, and a switch 919 selects one from these signals. By arranging that either one of the signal passing through the delay circuit 917 and the signal not passing through the delay circuit 917 is selected based on whether a value of the bit of the transmission data input to the terminal 916 is 1 or 0, it is possible to shift the start signal for the delay time of the delay circuit based on the value of the transmission data, thus the PPM modulation can be performed.

FIG. 11 shows the case of using the BPM as the modulation method. The pulse start signal input to a terminal 922 is input to a start terminal of a pulse generation circuit 925. As the pulse generation circuit 925, the circuit according to the fourth embodiment can be used. The pulse generated by the pulse generation circuit 925 is switched by a switch 926 to invert the polarity thereof based on the transmission data applied to a terminal 923. According to this operation, balanced pulses on which the BPM modulation is executed are obtained on terminals 927.

As in the present embodiment, by using the pulse generation circuit according to the embodiment of the invention as the pulse generation circuit of the UWB transmitter, since the generated pulse has the spectrum with narrow spread and a low side lobe level, an influence exerted to other devices can be reduced without using any special filters.

In FIG. 9, the right section started from an antenna 905 shows a configuration of a reception circuit. Specifically, the UWB pulse signal received by the reception antenna 905 is amplified by a low-noise amplification circuit 906, and then input to mixer circuits 907 and 908 of I and Q, respectively. The mixer circuits 907, 908 execute multiplications on the input signal with template pulses generated by template pulse generation circuits 909, 929 to send the results to integration circuits (∫) 910, 911, respectively. The integration circuits 910, 911 remove high-frequency components of the signals thus mixed (multiplied) by the mixer circuits 907, 908, respectively, to execute demodulation. The judgment circuit 912 checks the intensity of each of the signals to judge the transmitted bit, and revert it to the transmitted data.

Here, as the template pulse generation circuits 909, 929, the pulse generation circuits according to the embodiment of the invention can be used. In particular, the pulse generation circuit according to the fourth embodiment is capable of generating the differential template pulses, and enables differential circuits to be used as the low-noise amplification circuit 906 and the mixer circuits 907, 908. The differential circuits cancel common-mode noise, and are suitable for low-voltage operations, and therefore convenient for low-power and low-noise device configuration. Further, if it is possible to use IQ temperate pulses with phases 90 degree different from each other, efficient reception becomes possible in both the BPM and the PPM. Specifically, in the modulation process of the BPM and the PPM, it is possible to adopt a method, for example, of providing the I channel to data demodulation while using the Q channel for tracking. This is because, by controlling the timing of the template generation so as to make the Q channel output become always zero, the output amplitude value becomes the maximum in the I channel, and according to such control, the tracking of synchronous detection becomes possible. As shown in FIG. 9, by using the two template pulse generation circuits 909, 929, and generating the start pulses so that the two template pulse generation circuits 909, 929 have phases 90 degrees different from each other, the IQ template pulses can be generated.

It is obvious that the other circuits according to the invention, namely the circuits of the first through third embodiments can also be used as the template pulse generation circuits. In the case of using these circuits, unbalanced circuits are used as the low-noise amplification circuit 906 and the mixer circuits 907, 908. Further, in the case in which the two channels of templates I and Q are necessary, it is possible to use two circuits each corresponding to one of the circuits according to the first through third embodiments, and start with a predetermined time difference similarly to the above.

Since the template pulses generated by the template pulse generation circuit of the receiver are not intended to radiate energy to a space, and therefore, it may seem that the band limitation therefor is not necessary. However, since the temperate pulse has the highest correlation value when the waveform thereof is the same as that of the pulse used in the transmitter, the same template generation circuit as used in the transmitter should ideally be used as the temperate generation circuit of the receiver. Further, it seems obvious that significant effect is exerted to reduction of the spurious radiation, which is a challenge in many receivers.

The pulse generation circuit according to any one of the embodiments of the invention is capable of generating a signal having a small variation in amplitude between the signals, good balancing, and low distortion with a simple circuit configuration. Moreover, the power consumption is low. Therefore, the pulse generation circuit according to any one of the embodiments of the invention meets all of the required specifications necessary for improvement in performance of the UWB communication device, such as differential signal generation, IQ signal generation, or low distortion. Therefore, by applying the pulse generation circuit according to any one of the embodiments of the invention to the UWB communication device, a high-performance device can be realized.

Further by realizing the present circuit as a CMOS integrated circuit, power is consumed only in transition durations while generating the pulses, thus a so-called idling current can be eliminated. In the case of applying the circuit to communication devices, it is possible to always operate with the minimum power consumption in accordance with an amount of information (a bit rate) to be transmitted.

Although the power supplies connected to the respective switch arrays are hereinabove explained as the voltage sources for supplying the voltages $\{VN_i\}$, $\{VP_i\}$, they can be current sources or power sources for supplying other electric quantities.

The invention has a particularly significant advantage when applied to the UWB communication using short pulses.

The entire disclosure of Japanese Patent Application No. 2007-267492, filed Oct. 15, 2007 is expressly incorporated by reference herein.

What is claimed is:

1. A pulse generation circuit for outputting a pulse with a predetermined waveform to an output terminal in response to a start signal, comprising:

a circuit adapted to generate a plurality of signals {Di|i denotes an integer in a predetermined range}, which has predetermined amounts of time differences from the start signal, based on the start signal;

a plurality of power supplies {Ej|j denotes an integer} adopted to supply electric energy of a predetermined electric quantity; and a switching circuit adapted to sequentially switch the power supplies {Ej} in a predetermined order in accordance with logical function values of at least a part of the signals {Di} to connect the power supplies {Ej} to the output terminal;

wherein each of the plurality of power supplies {Ej} is a different voltage source having a sampling value of an envelope of the pulse intended to be output as an output voltage.

2. The pulse generation circuit according to claim 1, wherein the circuit adapted to generate a plurality of signals {Di} having predetermined amounts of time differences is formed of delay circuits each having a predetermined delay amount connected in series.

3. A UWB communication device, comprising:

the generation circuit according to claim 1.

* * * * *